US012713720B2

(12) United States Patent
Kim et al.

(10) Patent No.: US 12,713,720 B2
(45) Date of Patent: Aug. 18, 2026

(54) IMAGE SENSOR

(71) Applicant: SAMSUNG ELECTRONICS CO., LTD., Suwon-si (KR)

(72) Inventors: Yunhyeok Kim, Hwaseong-si (KR); Jungbin Yun, Hwaseong-si (KR); Hongsuk Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 910 days.

(21) Appl. No.: 17/946,271

(22) Filed: Sep. 16, 2022

(65) Prior Publication Data

US 2023/0207583 A1 Jun. 29, 2023

(30) Foreign Application Priority Data

Dec. 27, 2021 (KR) ........................ 10-2021-0188683
Mar. 7, 2022 (KR) ........................ 10-2022-0028646

(51) Int. Cl.
*H10F 39/00* (2025.01)
*H04N 25/70* (2023.01)
*H10F 39/18* (2025.01)

(52) U.S. Cl.
CPC ......... *H10F 39/8027* (2025.01); *H04N 25/70* (2023.01); *H10F 39/182* (2025.01)

(58) Field of Classification Search
None
See application file for complete search history.

(56) References Cited

U.S. PATENT DOCUMENTS 9,165,959 B2 10/2015 Chen et al.
9,960,201 B2 5/2018 Lee et al.
(Continued)

FOREIGN PATENT DOCUMENTS

KR 10-2016-0025939 A 3/2016
KR 10-2018-0038148 A 4/2018
(Continued)

OTHER PUBLICATIONS

Shinya Ichino, et al. "Statistical Analyses of Random Telegraph Noise in Pixel Source Follower with Various Gate 1 Shapes in CMOS Image Sensor", ITE Trans, on MTA vol. 6, No. 3, pp. 163-170 (2018).
(Continued)

*Primary Examiner* — Benjamin P Sandvik
(74) *Attorney, Agent, or Firm* — Morgan, Lewis & Bockius LLP

(57) ABSTRACT

An image sensor includes: a pixel array including a plurality of pixels; and a logic circuit acquiring a pixel signal from the plurality of pixels, wherein each of the plurality of pixels includes a photodiode and a pixel circuit region disposed on the photodiode, wherein the pixel array includes a plurality of pixel groups each having four or more pixels, among the plurality of pixels, adjacent to each other in the first direction and the second direction, wherein the pixel circuit region in each of the plurality of pixel groups includes a plurality of transistors, wherein at least one of the plurality of transistors is a driving transistor including a first active region, a second active region, and a gate structure disposed between the first active region and the second active region in a third direction intersecting the first direction and the second direction.

18 Claims, 20 Drawing Sheets

(56) References Cited

U.S. PATENT DOCUMENTS

| | | | | |
|---|---|---|---|---|
| 10,529,755 | B2 | 1/2020 | Lee et al. | |
| 10,608,026 | B2 | 3/2020 | Go et al. | |
| 10,727,268 | B1 | 7/2020 | Xu et al. | |
| 10,804,302 | B2 | 10/2020 | Tian et al. | |
| 11,152,404 | B2 | 10/2021 | Wang et al. | |
| 11,265,498 | B2 | 3/2022 | Jin et al. | |
| 2016/0064446 | A1* | 3/2016 | Lee | H10F 39/80377 257/368 |
| 2018/0182804 | A1* | 6/2018 | Lee | H04N 25/77 |
| 2020/0029047 | A1* | 1/2020 | Jin | H10F 39/18 |
| 2020/0219925 | A1 | 7/2020 | Jang | |
| 2020/0357835 | A1 | 11/2020 | Ma | |
| 2021/0025993 | A1 | 1/2021 | Choi et al. | |
| 2021/0136310 | A1 | 5/2021 | Uchida | |
| 2021/0242257 | A1* | 8/2021 | Lee | H04N 25/778 |
| 2021/0358980 | A1 | 11/2021 | Oh et al. | |

FOREIGN PATENT DOCUMENTS

| | | | |
|---|---|---|---|
| KR | 10-2021-0099350 | A | 8/2021 |
| KR | 10-2021-0139089 | A | 11/2021 |

OTHER PUBLICATIONS

Office Action dated Sep. 16, 2025 issued in corresponding to Korean Patent Application No. 10-2022-0028646.

Notice of Allowance dated May 13, 2026 issued in corresponding to Korean Patent Application No. 10-2022-0028646.

* cited by examiner

IMAGE SENSOR

CROSS-REFERENCE TO RELATED APPLICATION

This application claims the priority under 35 USC 119(a) to Korean Patent Application Nos. 10-2021-0188683 filed on Dec. 27, 2021 and 10-2022-0028646 filed on Mar. 7, 2022, in the Korean Intellectual Property Office, the disclosures of which are incorporated by reference herein in their entireties.

TECHNICAL FIELD

The present inventive concept relates to an image sensor.

DISCUSSION OF THE RELATED ART

Image sensors including semiconductor devices that generate an electrical signal upon receiving incident light, may generally include a pixel array having a plurality of pixels, a logic circuit driving the pixel array and generating an image, and the like. Each of the pixels may include a photodiode and a pixel circuit that converts charges generated by the photodiode into an electric signal. As the number of pixels included in the image sensors increases and the size of each of the pixels decreases, various methods for forming devices disposed in each of the pixels to provide a pixel circuit have been under development.

SUMMARY

An aspect of the present inventive concept is to provide an image sensor in which noise may be reduced and performance may be increased by implementing a structure of a driving transistor of a pixel circuit.

According to an example embodiment of the present inventive concept, an image sensor includes: a pixel array including a plurality of pixels arranged in first and second directions that are parallel to an upper surface of a substrate and substantially perpendicular to each other; and a logic circuit acquiring a pixel signal from the plurality of pixels, wherein each of the plurality of pixels includes at least one photodiode and a pixel circuit region disposed on the at least one photodiode, wherein the pixel array includes a plurality of pixel groups each having four or more pixels, among the plurality of pixels, adjacent to each other in the first direction and the second direction, wherein the pixel circuit region in each of the plurality of pixel groups includes a plurality of transistors, wherein at least one of the plurality of transistors is a driving transistor including a first active region, a second active region, and a gate structure disposed between the first active region and the second active region in a third direction parallel to the upper surface of the substrate and intersecting the first direction and the second direction.

According to an example embodiment of the present inventive concept, an image sensor includes: a pixel array including a plurality of pixels arranged in first and second directions parallel to an upper surface of a substrate and substantially perpendicular to each other; and a logic circuit acquiring a pixel signal from the plurality of pixels, wherein each of the plurality of pixels includes at least one photodiode and devices disposed on the at least one photodiode, wherein the plurality of pixel are separated from each other by a pixel separation layer, wherein the devices of each of the plurality of pixels include a floating diffusion region, a transfer gate structure, and at least one transistor, and wherein a gate structure of the at least one transistor in at least one of the plurality of pixels includes a first gate region, a second gate region, and a third gate region, wherein the first gate region extends in the first direction, wherein the second gate region extends in the second direction, and wherein the third gate region extends in a direction different from the first direction and the second direction, and wherein the first gate region and the second gate region are disposed on the pixel separation layer, and the third gate region is separated from the pixel separation layer.

According to an example embodiment of the present inventive concept, an image sensor includes: a pixel array including a plurality of pixels are arranged in first and second directions parallel to a first surface of a substrate and substantially perpendicular to each other; and a logic circuit acquiring a pixel signal from the plurality of pixels, wherein each of the plurality of pixels includes at least one photodiode and a pixel circuit region disposed on the at least one photodiode, wherein the pixel array includes a plurality of pixel groups each having four or more pixels, among the plurality of pixels, adjacent to each other in the first direction and the second direction, wherein the pixel circuit region in each of the plurality of pixel groups includes a plurality of transistors, wherein at least one of the plurality of transistors is a driving transistor including a first active region, a second active region, and a gate structure, wherein at least one of the first active region or the second active region is adjacent to a corner of a pixel including the driving transistor, and wherein the gate structure is separated from the corner.

BRIEF DESCRIPTION OF DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, example embodiments of the present inventive concept will be described with reference to the accompanying drawings.

Figure 1:
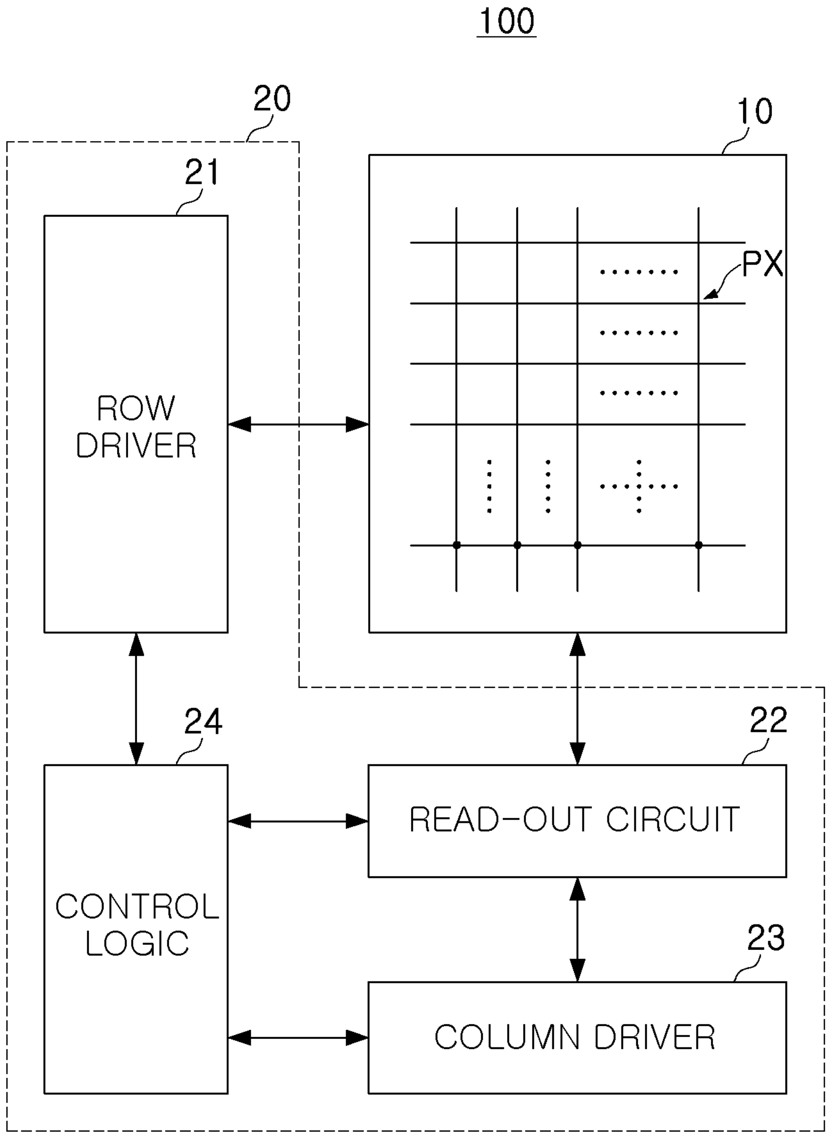
FIG. 1 is a block diagram schematically illustrating an image sensor according to an example embodiment of the present inventive concept.

FIG. 1 is a block diagram schematically illustrating an image sensor according to an example embodiment of the present inventive concept.

Referring to FIG. 1, an image sensor 100 may include a pixel array 10 and a logic circuit 20.

The pixel array 10 may include a plurality of pixels PX arranged in an array form along a plurality of rows and a plurality of columns. Each of the plurality of pixels PX may include at least one photoelectric transformation element generating a charge in response to light and a pixel circuit generating a pixel signal corresponding to the charge generated by the photoelectric transformation element. The photoelectric transformation element may include a photodiode formed of a semiconductor material and/or an organic photodiode formed of an organic material.

For example, the pixel circuit may include a floating diffusion, a transfer transistor, a reset transistor, a driving transistor, and a selection transistor. A configuration of the pixels PX may vary according to example embodiments. For example, each of the pixels PX may include an organic photodiode including an organic material or may be implemented as a digital pixel. When the pixels PX are implemented as digital pixels, each of the pixels PX may include an analog-to-digital converter (ADC) for outputting a digital pixel signal.

The logic circuit 20 may include circuits for controlling the pixel array 10. For example, the logic circuit 20 may include a row driver 21, a read-out circuit 22, a column driver 23, a control logic 24, and the like. The row driver 21 may drive the pixel array 10 in units of row lines. For example, the row driver 21 may generate a transfer control signal for controlling the transfer transistor of the pixel circuit, a reset control signal for controlling the reset transistor, a selection control signal for controlling the selection transistor, and the like, and may input the generated signals to the pixel array 10 in units of row lines.

The read-out circuit 22 may include a correlated double sampler (CDS), an ADC, and the like. The CDSs may be connected to the pixels PX through column lines. The CDSs may read a pixel signal through the column lines from the pixels PX connected to a row line selected by a row line selection signal from the row driver 21. The ADC may convert the pixel signal, which is detected by the CDS, into a digital pixel signal and transmit the converted pixel signal to the column driver 23.

The column driver 23 may include a latch or buffer circuit, an amplifier circuit, and the like, and may process a digital pixel signal received from the read-out circuit 22. The latch or buffer circuit may temporarily store a digital pixel signal. The row driver 21, the read-out circuit 22, and the column driver 23 may be controlled by the control logic 24. The control logic 24 may include a timing controller for controlling an operation timing of the row driver 21, the read-out circuit 22, and the column driver 23.

Among the pixels PX, the pixels PX arranged in the horizontal direction may share the same column line. For example, the pixels PX arranged in the vertical direction may be simultaneously selected by the row driver 21 and may output pixel signals through column lines. In an example embodiment of the present inventive concept, the read-out circuit 22 may simultaneously acquire the pixel signals from the pixels PX selected by the row driver 21 through the column lines. The pixel signal may include a reset voltage and a pixel voltage, and the pixel voltage may be a voltage in which charges generated in response to light in each of the pixels PX are reflected in the reset voltage.

The pixel signal output from each of the pixels PX may include noise. For example, at least a portion of the noise affecting the pixel signal may be affected by characteristics of the driving transistor, which is generating a reset voltage and a pixel voltage, by amplifying a voltage of the floating diffusion. For example, noise included in the pixel signal may vary according to an arrangement and shape of a gate structure and active regions included in the driving transistor.

In an example embodiment of the present inventive concept, the driving transistor is formed to have a structure for reducing noise included in the pixel signal, thereby improving a signal-to-noise ratio (SNR) of the pixel signal and increasing performance of the image sensor 100. In an example embodiment of the present inventive concept, by reducing an interface that the gate structure included in the driving transistor and reducing a separation region face, random noise may decrease and the performance of the image sensor may increase.

Figure 2:
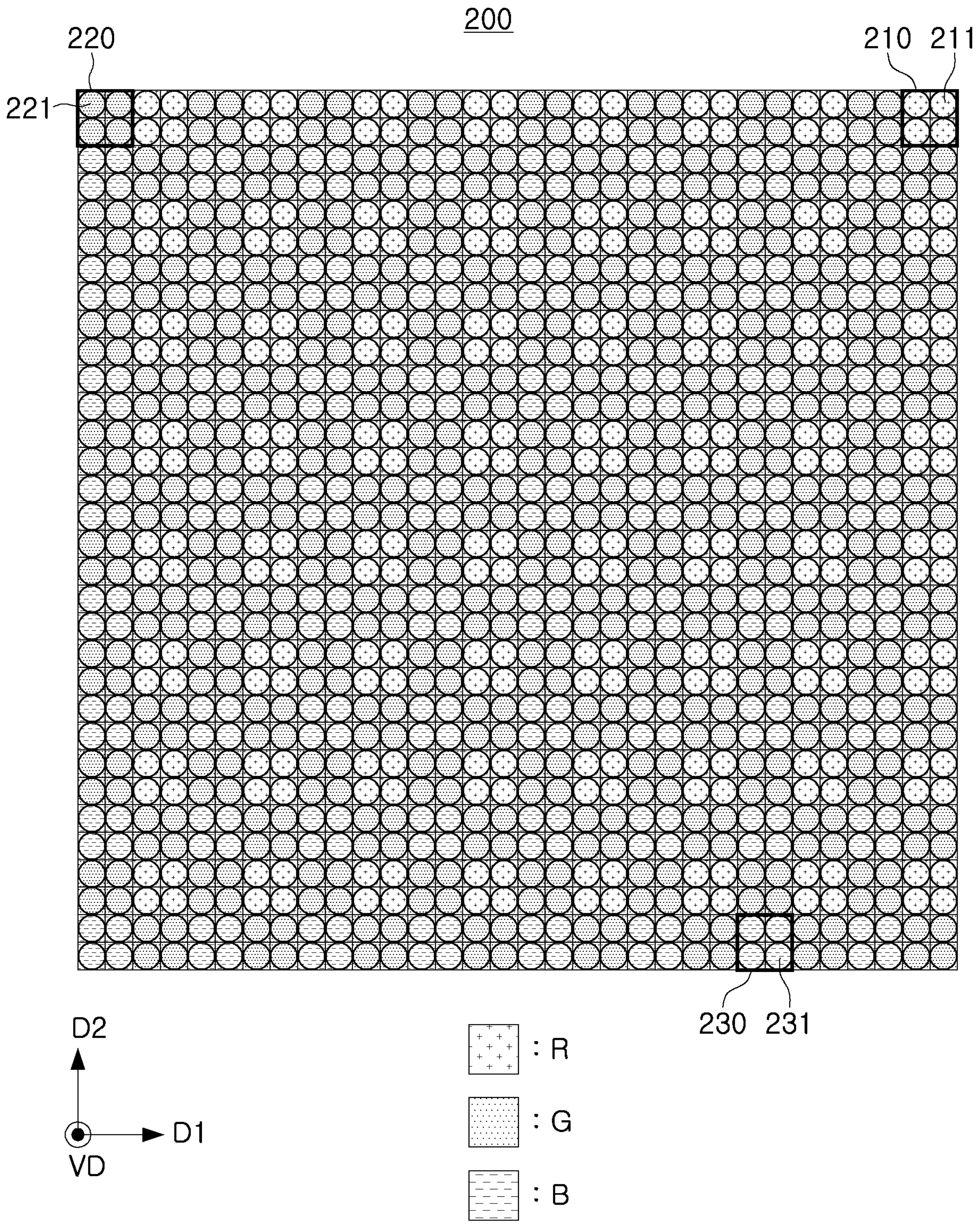
FIG. 2 is a diagram schematically illustrating a pixel array of an image sensor according to an example embodiment of the present inventive concept.

FIG. 2 is a diagram schematically illustrating a pixel array of an image sensor according to an example embodiment of the present inventive concept.

Referring to FIG. 2, a pixel array 200 of an image sensor according to an example embodiment of the present inventive concept may include a plurality of pixel groups 210, 220, and 230 arranged in a first direction D1 and a second direction D2. Each of the plurality of pixel groups 210, 220, and 230 may include two or more pixels 211, 221, and 231. In the example embodiment of the present inventive concept, with reference to in FIG. 2, each of the plurality of pixel groups 210, 220, and 230 may include four pixels 211, 221, and 231 arranged in a 2×2 matrix form; however, the present inventive concept is not limited thereto. Each of the plurality of pixel groups 210, 220, and 230 may include two or more pixels 211, 221, and 231 adjacent to each other in at least one of the first direction D1 and the second direction D2.

In each of the plurality of pixel groups 210, 220, and 230, two or more pixels 211, 221, and 231 may include a color filter of the same color. For example, each of the first pixel groups 210 may include red pixels having a red color filter, and each of the second pixel groups 220 may include green pixels having a green color filter. In addition, each of the third pixel groups 230 may include blue pixels having a blue color filter. However, the color of the color filter may vary according to example embodiments of the present inventive concept. For example, each of the second pixel groups 220 alternately arranged with the first pixel groups 210 in the first direction D1 may include green pixels 221 having a green color filter, and each of the second pixel groups 220 alternately arranged with the third pixel groups 230 in the first direction D1 may include white pixels having a white color filter.

For example, the pixel array 200 may include a photodiode array, a color filter array, and a microlens array. The photodiode array may include a plurality of photodiodes formed on a semiconductor substrate in the first direction D1 and the second direction D2, and the plurality of photodiodes may be separated from each other in the first direction D1 and the second direction D2 by pixel separation layers.

For example, the color filter array may include a plurality of color filters disposed on one surface of the semiconductor substrate in the first direction D1 and the second direction D2, and the plurality of color filters may be separated from each other in the first direction D1 and the second direction D2 by a filter separation layer. The microlens array may be disposed above the color filter array, and thus the color filter array may be disposed between the microlens array and the photodiode in a vertical direction VD. In an example embodiment of the present inventive concept, each of the plurality of pixels 211, 221, and 231 may include one color filter, one microlens, and at least one photodiode.

Figure 3:
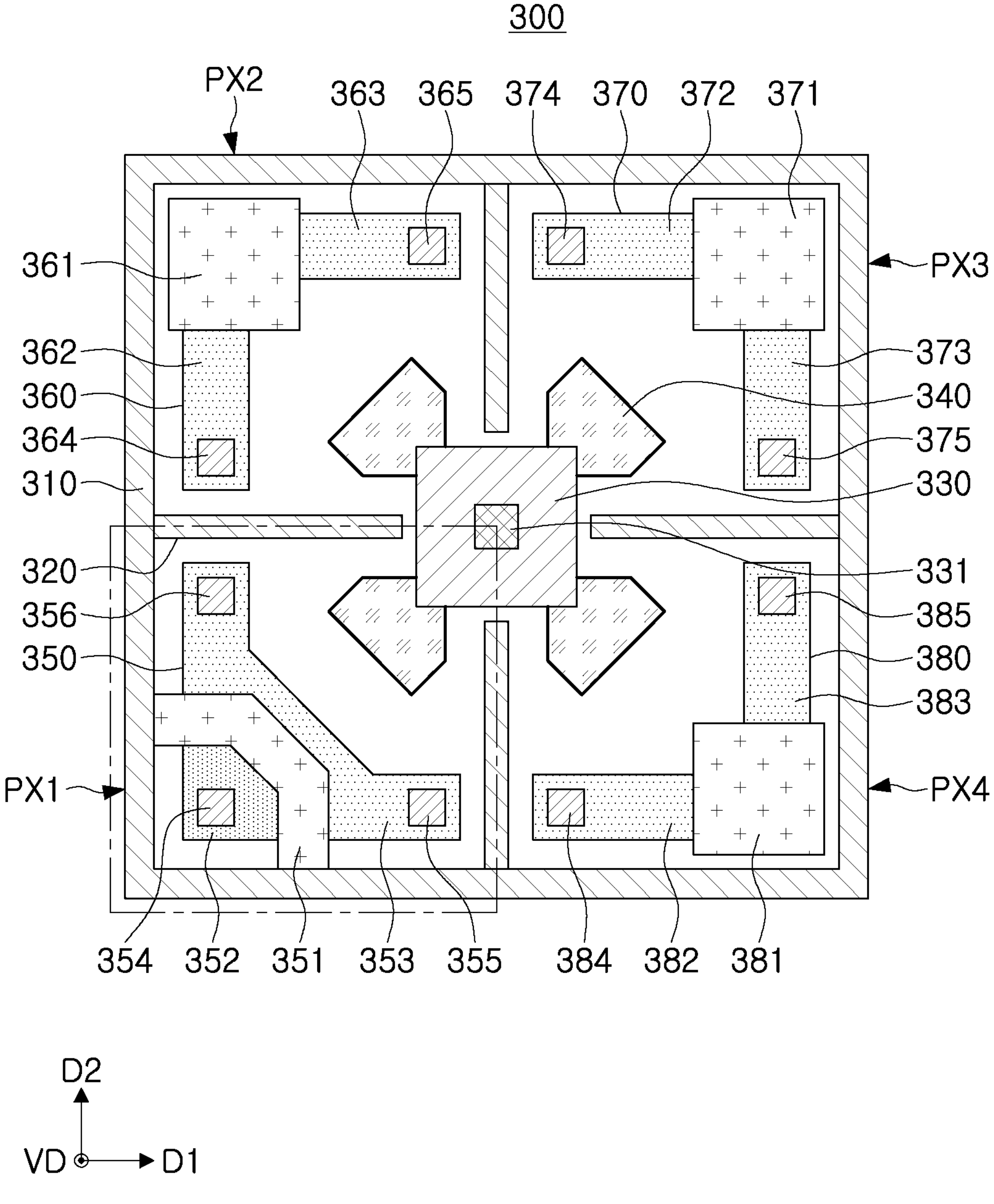
FIG. 3 is a diagram schematically illustrating pixels of an image sensor according to an example embodiment of the present inventive concept.

FIG. 3 is a diagram schematically illustrating pixels of an image sensor according to an example embodiment of the present inventive concept.

As an example, FIG. 3 may be a diagram schematically illustrating one of the pixel groups described above with reference to FIG. 2. Referring to FIG. 3, in a pixel array of an image sensor, first to fourth pixels PX1 to PX4 arranged in a 2×2 form in the first direction D1 and the second direction D2 may provide one pixel group 300. The first to fourth pixels PX1 to PX4 included in one pixel group 300 may each include a color filter of the same color and may each respectively include a microlens.

The pixel groups may be separated from other neighboring pixel groups by a first pixel separation layer 310. In each of the pixel groups, the pixels PX1 to PX4 may be separated from each other by a second pixel separation layer 320. Each of the pixels PX1 to PX4 may include a photodiode and a pixel circuit region disposed between the first pixel separation layer 310 and the second pixel separation layer 320. For example, the photodiode and pixel circuit region of each of the pixels PX1 and PX4 may be at least partially surrounded by the first pixel separation layer 310 and the second pixel separation layer 320. For example, a pixel circuit region of each of the pixels PX1 to PX4 may include a floating diffusion region 330, a transfer gate structure 340, and at least one transistor.

The first transistor 350 of the first pixel PX1 may include a first gate structure 351 and active regions 352 and 353 disposed on both sides (e.g., opposing sides) of the first gate structure 351. Similarly, the second to fourth transistors 360, 370, and 380 of the second to fourth pixels PX2 to PX4 may include second to fourth gate structures 361, 371, and 381 and active regions 362, 363, 372, 373, 382, and 383, each of which are disposed to be adjacent to the corresponding one of the second to fourth gate structures 361, 371, and 381. Active contacts 354, 355, and 356 may be connected to the active regions 352 and 353 of the first transistor 350. Similarly, active contacts 364, 365, 374, 375, 384, and 385 may be connected to the active regions 362, 363, 372, 373, 382, and 383 of the second to fourth transistors 360, 370, and 380, respectively.

The photodiode may generate and accumulate charges in response to externally incident light. The photodiode may be replaced with, for example, a phototransistor, a photogate, a pinned photodiode, or the like according to example embodiments of the present inventive concept. The transfer transistor may transfer charges generated by the photodiode to the floating diffusion region. The floating diffusion region may store charges generated by the photodiode. A voltage output from the driving transistor may vary according to the amount of charges accumulated in the floating diffusion region.

The floating diffusion region 330 may be a region doped with a first conductivity-type impurity and may be a region in which charges generated by the photodiode are accumulated. For example, the first conductivity-type impurity may be an N-type impurity. At least one floating diffusion contact 331 may be connected to the floating diffusion region 330, and the floating diffusion region 330 may be adjacent to the transfer gate structure 340. The floating diffusion contact 331 may be connected to at least one of the respective active regions 362, 363, 372, 373, 382, and 383 of the respective second to fourth transistors 360, 370, and 380 and the gate structure 351 of the first transistor 350 through wirings formed above the floating diffusion contact 331 in the vertical direction VD.

Between the first pixel separation layer 310 and the second pixel separation layer 320, the transfer gate structure 340 may be adjacent to a photodiode in the vertical direction VD. In the example embodiment illustrated in FIG. 3, the floating diffusion region 330 may be disposed at the center of the pixel group 300, and each of the pixels PX1 to PX4 of the pixel group 300 may share the floating diffusion region 330. However, the shape and/or area of the floating diffusion region 330 is not limited to the square shape of the floating diffusion region 330 illustrated in FIG. 3, and may vary according to example embodiments of the present inventive concept.

The transistors 350, 360, 370, and 380 may include a reset transistor, a selection transistor, and a driving transistor included in the pixel circuit. In the example embodiment illustrated in FIG. 3, the first transistor 350 may be a driving transistor. In addition, the second transistor 360 may be a selection transistor, and the third and fourth transistors 370 and 380 may be reset transistors. However, the types of transistors provided by each of the transistors 350, 360, 370, and 380 are not limited to the example embodiment illustrated in FIG. 3, and may vary.

As illustrated in FIG. 3, a structure of the driving transistor may be different from that of the reset transistor and the selection transistor. A detailed structure of the driving transistor will be described below.

Figure 4:
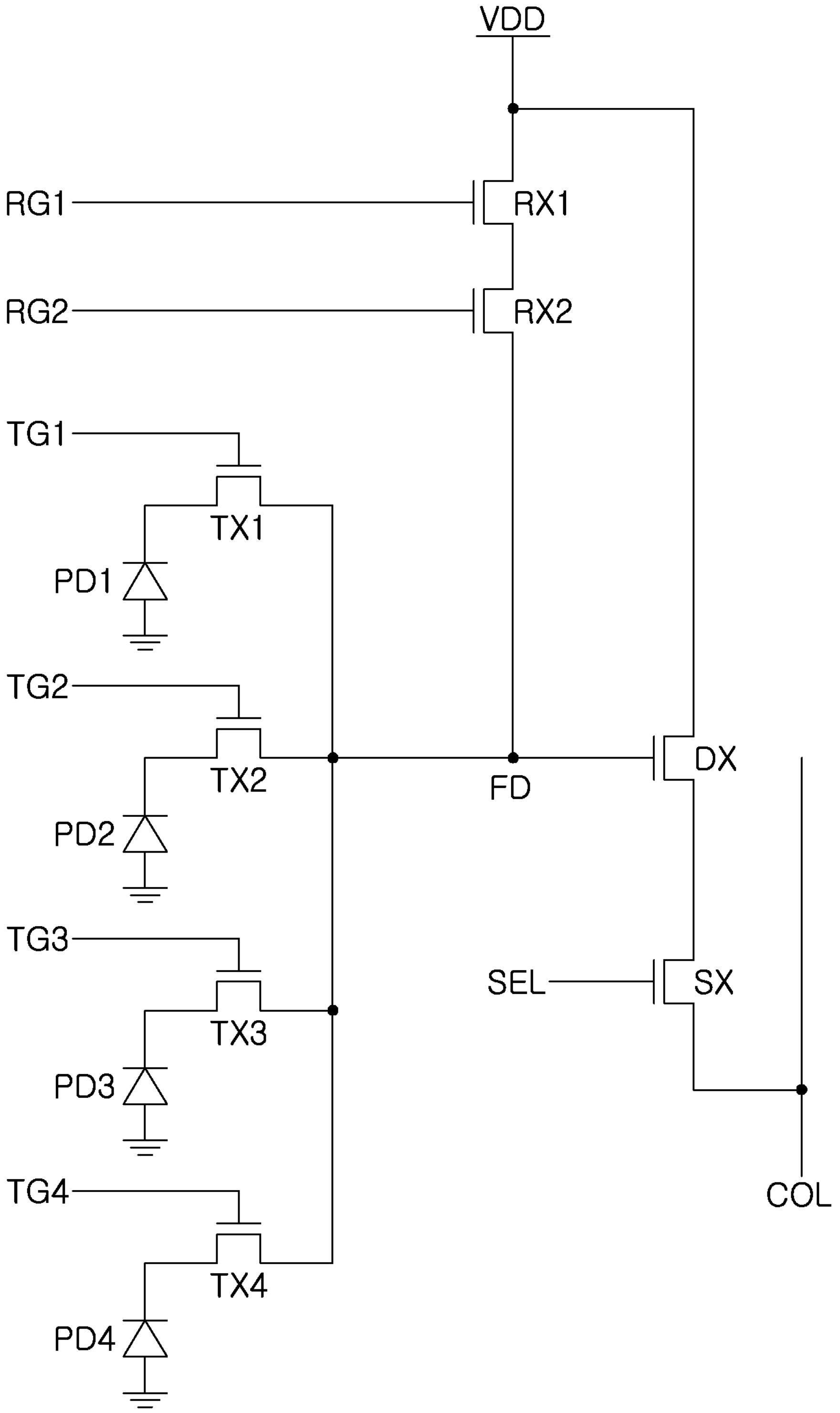
FIG. 4 is a circuit diagram schematically illustrating a pixel circuit according to the example embodiment illustrated in FIG. 3.

FIG. 4 is a circuit diagram schematically illustrating a pixel circuit according to the example embodiment illustrated in FIG. 3.

FIG. 4 may be a circuit diagram schematically illustrating a pixel circuit provided by the four photodiodes, four transfer gate structures 340, the floating diffusion region 330 shared by four pixels PX1 to PX4, and four transistors 350, 360, 370, and 380 included in the pixel group 300 illustrated in FIG. 3. Hereinafter, a configuration of the pixel circuit will be described with reference to FIG. 4.

Referring to FIG. 4, the pixel circuit may include a transfer transistor TX, a reset transistor RX, a selection transistor SX, and a driving transistor DX. In addition, the pixel circuit may include a floating diffusion node FD in which charges generated by the photodiode are accumulated. A first photodiode PD1 of a first pixel PX1 may be connected to the floating diffusion node FD through a first transfer transistor TX1. Similarly, second to fourth photodiodes PD2 to PD4 of the second to fourth pixels PX2 to PX4 may be connected to the floating diffusion node (FD) through second to fourth transistors TX2 to TX4, respectively.

The floating diffusion node FD may correspond to the floating diffusion region 330 shared by the first to fourth pixels PX1 to PX4. Each of the first to fourth transfer transistors TX1 to TX4 may be implemented by the transfer gate structures 340 of each of the first to fourth pixels PX1 to PX4, and may be turned on or turned off by first to fourth transfer control signals TG1 to TG4, respectively, input to the transfer gate structure 340.

The photodiode PD may generate and accumulate charges in response to externally incident light. The photodiode PD may be replaced with, for example, a phototransistor, a photogate, a pinned photodiode, etc. according to example embodiments of the present inventive concept. The transfer transistor TX (e.g., TX1-TX4) may move the charges generated by the photodiode PD (e.g., PD1-PD4) to the floating diffusion node FD. The floating diffusion node FD may store charges generated by the photodiode PD. A voltage output from the driving transistor DX may vary according to the amount of charges accumulated in the floating diffusion node FD.

The reset transistor RX may reset the voltage of the floating diffusion node FD by removing the charges accumulated in the floating diffusion node FD. When the reset transistor RX is turned on, a power voltage VDD may be applied to the floating diffusion node FD through the reset transistor RX, and the charges accumulated in the floating diffusion node FD may be removed.

The driving transistor DX may operate as a source follower buffer amplifier. The driving transistor DX may amplify a voltage change of the floating diffusion node FD and output an amplified voltage change to a column line COL. The selection transistor SX may select the pixels PX to be read in row units. When the selection transistor SX is turned on, a voltage of the driving transistor DX may be output to the column line COL. For example, when the selection transistor SX is turned on, a reset voltage or a pixel voltage may be output through the column line COL.

In the example embodiment illustrated in FIG. 4, the pixel circuit may include first and second reset transistors RX1 and RX2, a driving transistor DX, and a selection transistor SX. The first and second reset transistors RX1 and RX2 may be connected in series to each other and may be controlled by the first and second reset control signals RG1 and RG2, respectively. By connecting the first and second reset transistors RX1 and RX2 in series to each other, an image sensor capable of adjusting a conversion gain of a pixel may be implemented. For example, a logic circuit of the image sensor may reduce the conversion gain by turning the second reset transistor RX2 on. In addition, the logic circuit may increase the conversion gain by turning the second reset transistor RX2 off.

For example, the second and third transistors 360 and 370, among the four transistors 350, 360, 370, and 380 included in the first to fourth pixels PX1 to PX4, may be connected in series to each other to provide first and second reset transistors RX1 and RX2. The fourth transistor 380 may be configured to provide a selection transistor SX, and the first transistor 350 may be configured to provide a driving transistor DX.

However, the pixel circuit described above with reference to FIG. 4 is only an example, and the present inventive concept is not limited thereto. By designing wiring patterns included in the first to fourth pixels PX1 to PX4 to be different from that of FIG. 4, a pixel circuit having a structure different from that of FIG. 4 may be implemented. For example, the pixel circuit may be implemented using the four transistors 350, 360, 370, and 380. Further to that example, two of the four transistors 350, 360, 370, and 380 may be assigned as driving transistors, one may be assigned as a reset transistor, and the other may be assigned as a selection transistor.

Figure 5:
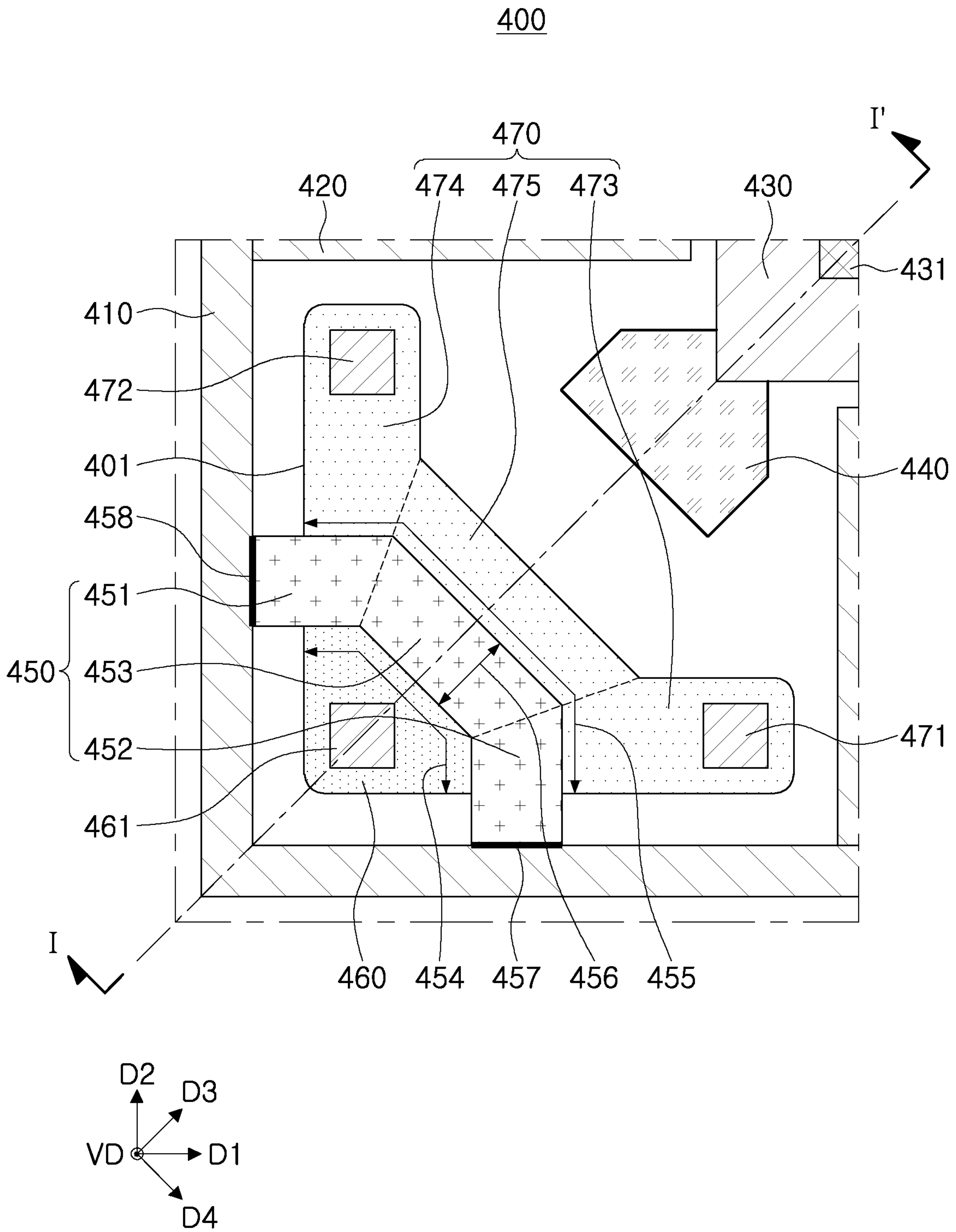
FIG. 5 is a diagram schematically illustrating a pixel of an image sensor according to an example embodiment of the present inventive concept.

FIG. 5 is a diagram schematically illustrating a pixel of an image sensor according to an example embodiment of the present inventive concept.

For example, FIG. 5 may be a diagram schematically illustrating one of the pixels included in the pixel group 300 according to the example embodiment illustrated in FIG. 3. Referring to FIG. 5, a pixel 400 of an image sensor according to an example embodiment of the present inventive concept may be separated from other neighboring pixel groups by a first pixel separation layer 410 and may be separated from other adjacent pixels in a pixel group by a second pixel separation layer 420.

For example, the pixel 400 may include a driving transistor 401, a transfer gate structure 440, and a floating diffusion region 430. A floating diffusion contact 431 may be disposed on the floating diffusion region 430. The driving transistor 401 may include a first active region 460, a second active region 470, and a gate structure 450. As described above with reference to FIG. 3, the driving transistor 401 may have a structure, different from that of transistors of other pixels included in the same pixel group as the pixel 400. For example, the shapes of the active regions 460 and 470 and the gate structure 450 of the driving transistor 401 may be different from those of the active regions and the gate structure of other transistors.

By forming the driving transistor 401 as illustrated in FIG. 5, noise that may occur in the image sensor may be reduced. During a manufacturing process of the image sensor, surplus charges may be generated due to defects occurring in an etching process for forming a separation region in the pixel 400, and the surplus charges may cause a dark current independent of light incident on the photodiode. A magnitude of the dark current may be affected by the area of the separation region. For example, as the area of the separation region increases, the dark current may increase. The separation region may be a shallow trench isolation (STI) region.

In addition, thermal noise may occur during the operation of the image sensor, and charges flowing along a channel of the driving transistor 401 may be trapped at an interface between the semiconductor substrate and the separation region, thereby causing flicker noise. Thermal noise occurring during the operation of the image sensor may be inversely proportional to a width of the channel, compared to a length of the channel of the transistor, and the flicker noise may be inversely proportional to the product of the length of the channel and the width of the channel.

In an example embodiment of the present inventive concept, to suppress dark current, thermal noise, and flicker noise, the active regions 460 and 470 and the gate structure 450 of the driving transistor 401 of the pixel circuit may be formed as illustrated in FIG. 5. Referring to FIG. 5, in a third direction D3 intersecting the first direction D1 and the second direction D2, the gate structure 450 may be disposed between the active regions 460 and 470 of the driving transistor 401. Accordingly, noise due to the dark current may be suppressed by reducing the area of the separation region. In addition, thermal noise and flicker noise may be reduced by increasing the width of the channel, compared to the length of the channel, and increasing the product of the length of the channel and the width of the channel, in the driving transistor 401.

The gate structure 450 of the driving transistor 401 may be divided into a first gate region 451 extending in a first direction D1, a second gate region 452 extending in a second direction D2, and a third gate region 453 extending in a fourth direction D4 parallel to the upper surface of the substrate and different from the first to third directions D1 to D3. For example, the fourth direction D4 may be a direction, perpendicular to the third direction D3. The first gate region 451 and the third gate region 453 may be connected to each other, and the second gate region 452 and the third gate region 453 may be connected to each other.

The gate structure 450 may include a first edge 457 and a second edge 458. The first edge 457 may be separated from the first active region 460 and the second active region 470, and may extend in the first direction D1. The second edge 458 may be separated from the first active region 460 and the second active region 470, and may extend in the second direction D2. For example, the first edge 457 and the second edge 458 may be adjacent to the pixel separation layer 410, and a length of the first edge 457 may be substantially the same as a length of the second edge 458. For example, the first edge 457 and the second edge 458 may contact the pixel separation layer 410, or an intervening layer may be between the first edge 457 and the pixel separation layer 410 and between the second edge 458 and the pixel separation layer 410. In addition, in an example embodiment of the present inventive concept, the length of the first edge 457 may be different from the length of the second edge 458.

A first active contact 461 may be connected to the first active region 460 of the driving transistor 401, and second active contacts 471 and 472 may be connected to the second active region 470. The number of the first active contacts 461 may be different from that of the second active contacts 471 and 472. According to the example embodiment illustrated in FIG. 5, the area of the first active region 460 may be less than the area of the second active region 470, and the number of first active contacts 461 may be less than the number of the second active contacts 471 and 472. In addition, the number of the first active contacts 461 and the number of the second active contacts 471 and 472 may vary according to example embodiments of the present inventive concept.

For example, one active contact 461 may be connected to the first active region 460, and two active contacts 471 and 472 may be connected to the second active region 470. The first active region 460 may be a drain region, and the second active region 470 may be a source region. However, the present inventive concept is not limited thereto, and the first active region 460 may be a source region, and the second active region 470 may be a drain region.

At least one of the first active region 460 or the second active region 470 of the driving transistor 401 may be positioned at a corner of the pixel 400, and the gate structure 450 may be separated from the corner of the pixel 400. For example, the areas of the first gate region 451 and the second gate region 452 may be substantially the same, and the gate structure 450 may have a symmetrical structure with respect to the third direction D3. For example, the areas of the first gate region 451 and the second gate region 452 may be smaller than the area of the third gate region 453, individually or combined. For example, a length of a first side surface 454, of the gate structure 450, contacting the first active region 460 may be different from a length of a second side surface 455, of the gate structure 450, contacting the second active region 470. For example, the length 456 of the channel of the driving transistor 401 may be less than about ½ of the width of the channel, which is an average value of the length of the first side surface 454 and the length of the second side surface 455. For example, based on the length of the first side surface 454 and the length of the second side surface 455, the width of the channel of the driving transistor 401 may gradually increase in the third direction D3.

The second active region 470 may be divided into a first region 473, a second region 474, and a third region 475. The first region 473 may extend in the first direction D1, the second region 474 may extend in the second direction D2, the third region 475 may extend in the fourth direction D4 and may be adjacent to the third gate region 453. For example, the second active region 470 may have a symmetrical structure with respect to the third direction D3. Active contacts 471 and 472 of the second active region 470 may be connected to at least one of the first region 473 and/or the second region 474.

According to the example embodiment illustrated in FIG. 5, the first active region 460 may be disposed adjacent to a corner of the pixel 400, and the area of the separation region may be reduced by expanding the area of the second active region 470. In addition, by forming the gate structure 450 to include the first to third gate regions 451 to 453, a length of a channel may be decreased while a width of the channel is increased. Thermal noise may be reduced by increasing the width of the channel compared to the length of the channel, and flicker noise may be reduced by increasing the product of the length of the channel and the width of the channel. In addition, by reducing a region in which the gate structure 450 and the separation region directly contact each other, a probability that charges are trapped at the interface between the gate structure 450 and the separation region, while the charge flows through the channel, may be reduced.

Figure 6:
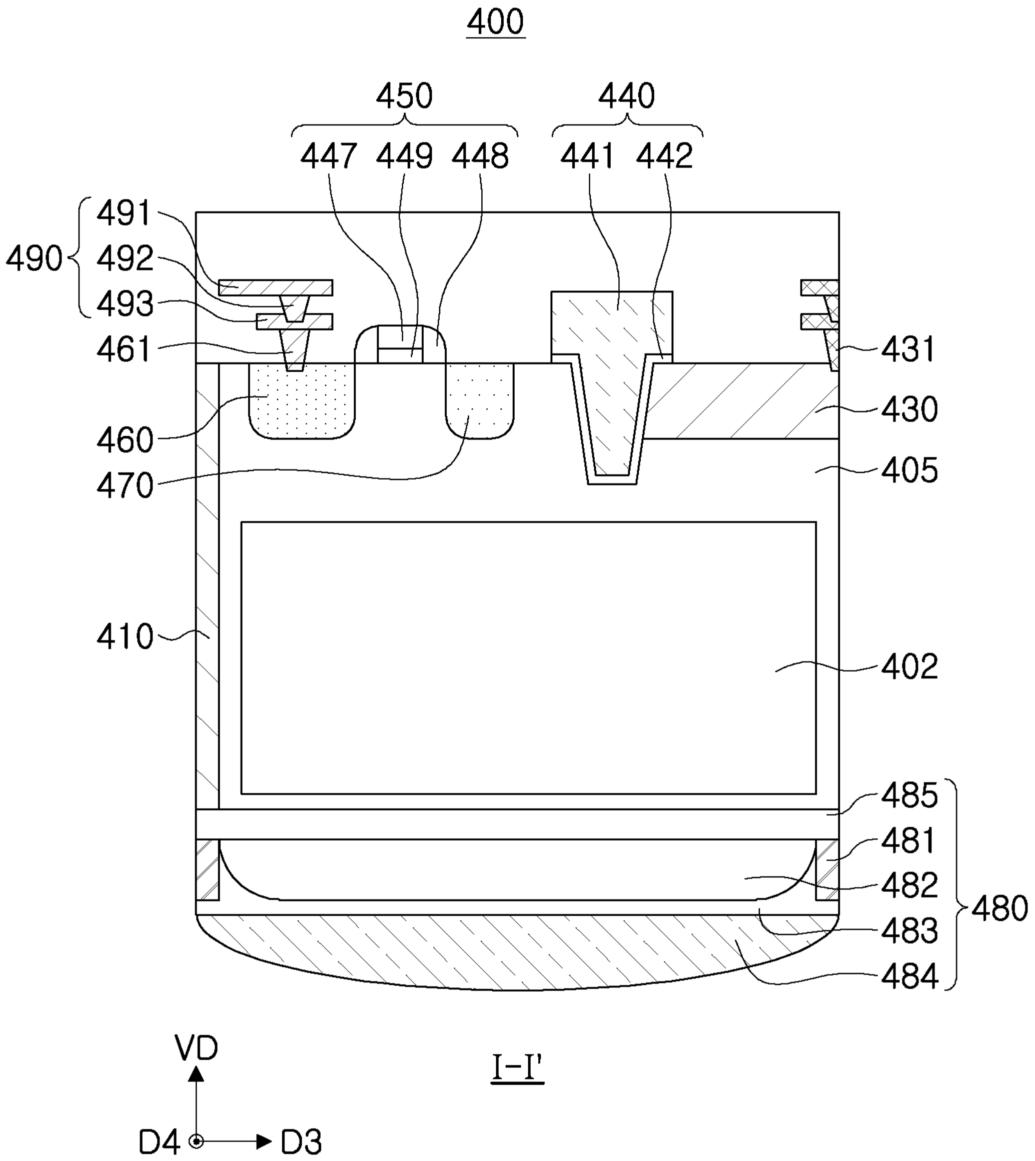
FIG. 6 is a cross-sectional view of FIG. 5, taken along line I-I'.

FIG. 6 is a cross-sectional view, taken along line I-I' of FIG. 5.

Referring to FIG. 6, a photodiode 402 may be formed in a substrate 405, and the photodiode 402 may be adjacent to the transfer gate structure 440 in a vertical direction VD substantially perpendicular to the upper surface of the substrate 405. An optical unit 480 may be disposed on one surface of the substrate 405 adjacent to the photodiode 402 in the vertical direction VD. The optical unit 480 may include a grating structure 481, a color filter 482, a planarization layer 483, a microlens 484, and a horizontal insulating layer 485.

The color filter 482 may be separated from the color filters of other adjacent pixels by the grating structure 481, and may transmit light in a predetermined wavelength band. The microlens 484 refracts light that is incident on the pixel 400 to focus the light on the photodiode 402. The photodiode 402 may generate a charge in response to light passing through the optical unit 480.

The horizontal insulating layer 485 may be formed between the color filter 482 and the substrate 405. In an example embodiment of the present inventive concept, the horizontal insulating layer 485 may include a plurality of insulating layers formed of different materials, and at least one of the plurality of insulating layers may be formed of a high-κ material. For example, the high-κ dielectric layer may include a material, such as hafnium oxide (HfO), aluminum oxide (AlO), or tantalum oxide (TaO), whose dielectric constant is greater than that of a silicon oxide layer. For example, the insulating layer formed of a high-κ material may be a layer in direct contact with the substrate 405.

In addition, a pixel circuit region may be disposed on one side of the photodiode 402 in the vertical direction VD. For example, the pixel circuit region may be disposed below the photodiode 402; however, the present inventive concept is not limited thereto. Accordingly, the optical unit 480 and the pixel circuit region may be disposed on both sides (e.g., opposing sides) of the photodiode 402 in the vertical direction VD. The pixel circuit region may include a floating diffusion region 430, a transfer gate structure 440 adjacent to the floating diffusion region 430, and at least one transistor. The transistor may include the gate structure 450, the first active region 460, and the second active region 470. The first active region 460 and the second active region 470 may be disposed on opposing sides of the gate structure 450, respectively. The gate structure 450 may include a gate insulating layer 449 disposed on the substrate 405, a gate electrode 447 disposed on the gate insulating layer 449, and gate spacers 448 disposed on side surfaces of the gate electrode 447 and the gate insulating layer 449.

A conductive structure 490 may be disposed on the first active contact 461 that is disposed on the first active region 460. The conductive structure 490 may include a first conductive layer 493 disposed on the first active contact 461, a first via 492 disposed on the first conductive layer 493, and a second conductive layer 491 disposed on the first via 492. The conductive structure 490 may include a metal material.

The transfer gate structure 440 may include a gate dielectric layer 442 and a transfer gate electrode 441. The gate dielectric layer 442 may be disposed within the substrate 405, and the transfer gate electrode 441 may be disposed on the gate dielectric layer 442. The gate dielectric layer 442 may be disposed between the transfer gate electrode 441 and the floating diffusion region 430.

Charges generated in the photodiode 402 may be accumulated in the photodiode 402 or may move to the floating diffusion region 430 according to a magnitude of a voltage input to the transfer gate structure 440. For example, while a first bias voltage is input to the transfer gate structure 440, charges may be accumulated in the photodiode 402, and when a second bias voltage greater than a first bias voltage is input to the transfer gate structure 440, charges inside the photodiode 402 may move to the floating diffusion region 430. In an example embodiment of the present inventive concept, the first bias voltage may be a negative voltage.

Figure 7:
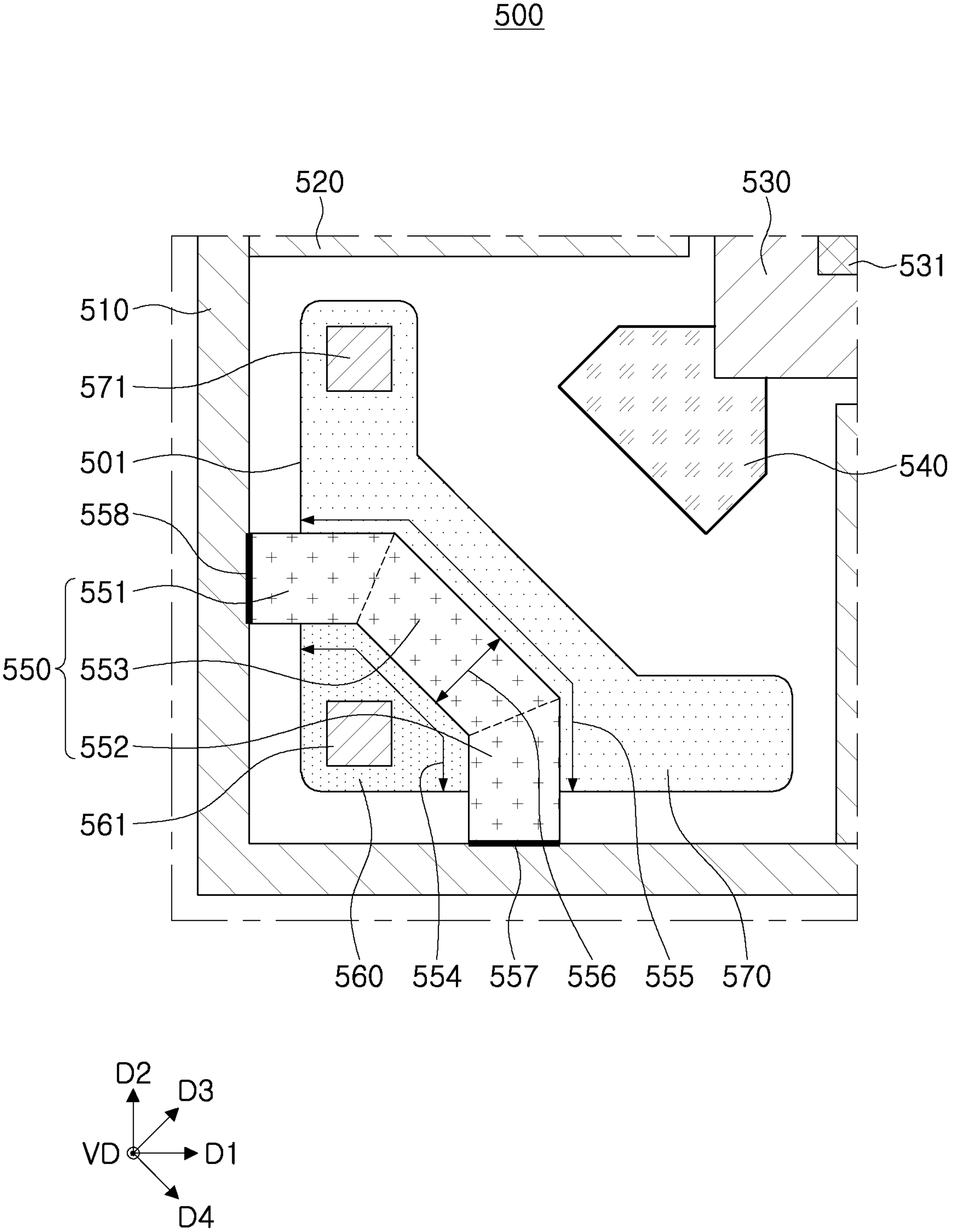
FIGS. 7 and 8 are diagrams schematically illustrating pixels of an image sensor according to an example embodiment of the present inventive concept.
Figure 8:
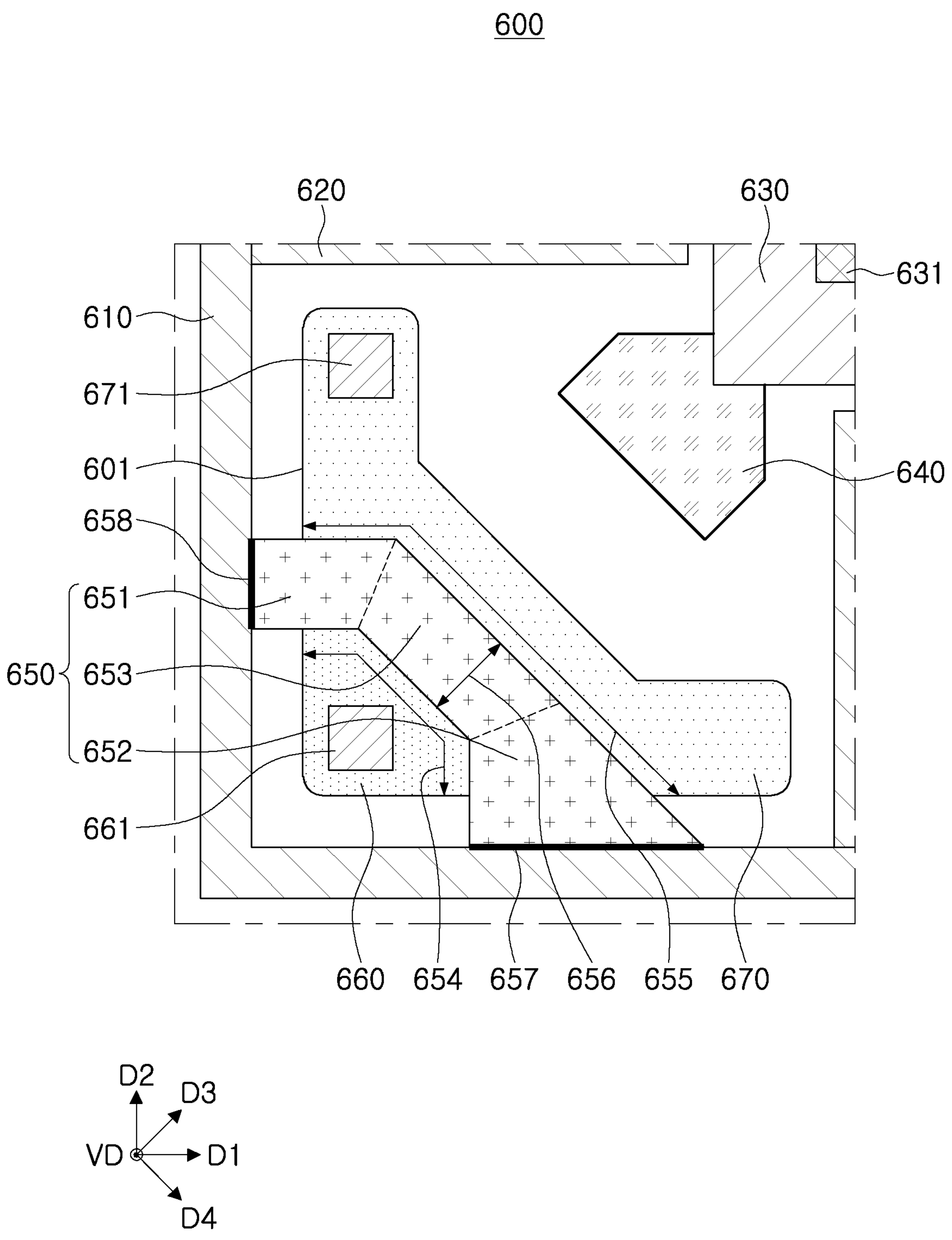

FIGS. 7 and 8 are diagrams schematically illustrating pixels of an image sensor according to an example embodiment of the present inventive concept.

As an example, FIGS. 7 and 8 may be diagrams schematically illustrating pixels included in one of the pixel groups of the image sensor according to the example embodiment illustrated in FIG. 2. Each of the pixels 500 and 600 according to the example embodiment illustrated in FIGS. 7 and 8 may include floating diffusion regions 530 and 630, transfer gate structures 540 and 640, and at least one transistor 501 and 601. The transistors 501 and 502 of each of the pixels 500 and 600 according to the example embodiment illustrated in FIGS. 7 and 8 may operate as driving transistors in the pixel circuit, and may include first active regions 560 and 660, second active regions 570 and 670, and gate structures 550 and 650. The description of the driving transistor may be understood based on the example embodiments described above with reference to FIGS. 3 and 4.

Referring first to FIG. 7, in the pixel 500 according to an example embodiment of the present inventive concept, one active contact 571 may be connected to the second active region 570. For example, the first active region 560 may be a drain region, and the second active region 570 may be a source region. However, the present inventive concept is not limited thereto, and the first active region 560 may be a source region, and the second active region 570 may be a drain region.

Referring to FIG. 8, compared to the example embodiment illustrated in FIG. 5, in the pixel 600 according to the example embodiment illustrated in FIG. 8, one active contact 671 may be connected to the second active region 670. The first active region 660 may be a drain region, and the second active region 670 may be a source region. However, the present inventive concept is not limited thereto, and the first active region 660 may be a source region, and the second active region 670 may be a drain region.

In the transistor 601 of the pixel 600 according to the example embodiment illustrated in FIG. 8, the area and shape of the first gate region 651 and the second gate region 652 may be different from each other, and the transistor 601 may have an asymmetrical structure in the third direction D3. For example, the area of the second gate region 652 may be greater than the area of the first gate region 651 and the area of the third gate region 653, individually or combined, and a length of a first edge 657 may be different from a length of a second edge 658. For example, the length of the first edge 657 may be greater than the length of the second edge 658. The active contact 671 of the second active region 670 may be disposed closer to the first gate region 651 that has an area smaller than that of the second gate region 652, compared to the second gate region 652.

FIGS. 9A, 9B, 10A, and 10B are diagrams illustrating flow of charges in a transistor according to an example embodiment of the present inventive concept.

Figure 9A:
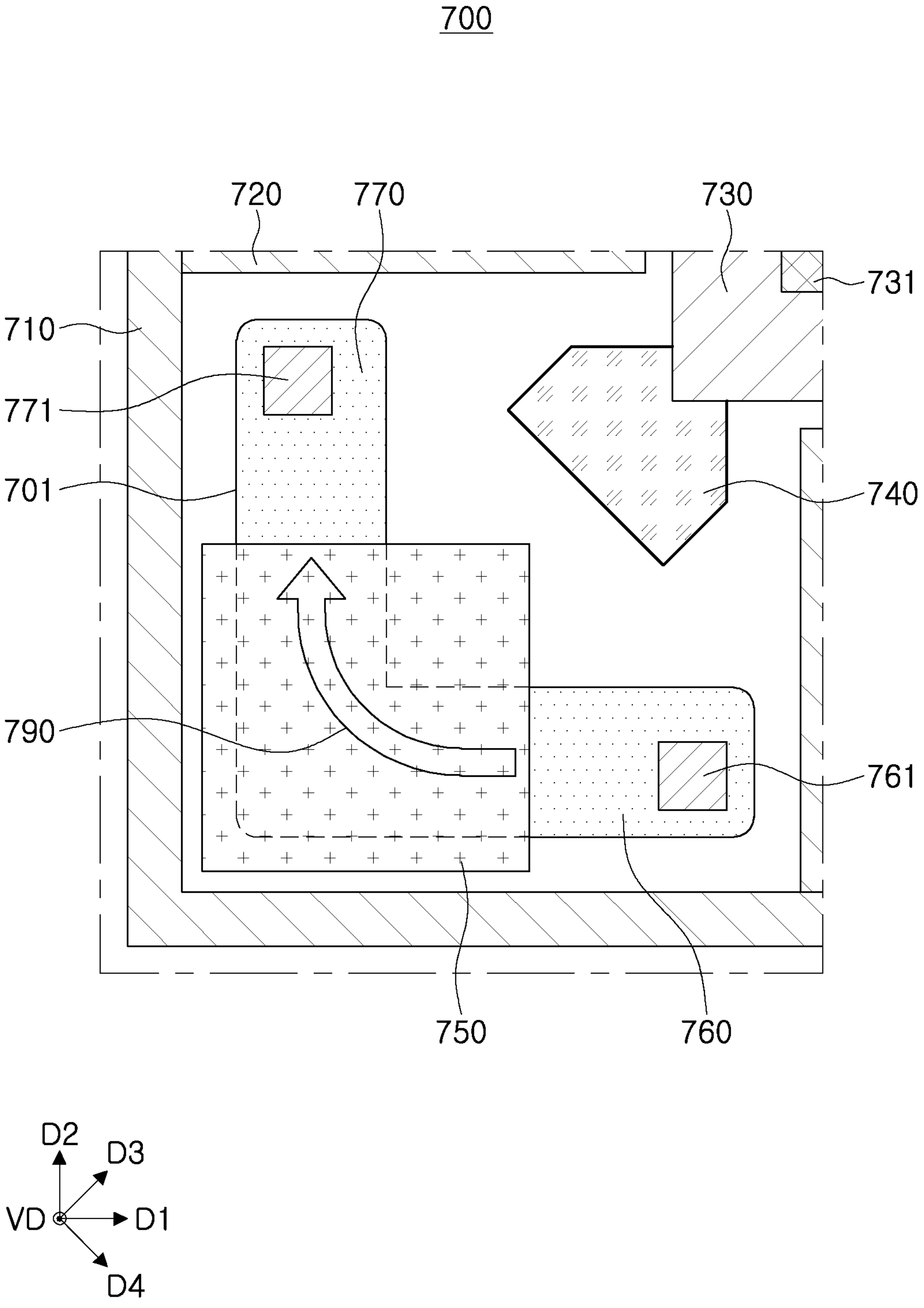
FIGS. 9A, 9B, 10A, and 10B are diagrams illustrating flow of charges in a transistor according to an example embodiment of the present inventive concept.

Referring first to FIG. 9A, a pixel 700 of an image sensor according to an example embodiment may include a transistor 701, a transfer gate structure 750, and a floating diffusion region 730. The transistor 701 may include a gate structure 750 and active regions 760 and 770 disposed adjacent to the gate structure 750. The gate structure 750 may be disposed at a corner of the pixel 700. For example, the gate structure 750 may have a square shape. The first active region 760 may extend in the first direction D1, and the second active region 770 may extend in the second direction D2. Active contacts 761 and 771 may be connected to the first active region 760 and the second active region 770, respectively. The first active region 760 may be a source region, and the second active region 770 may be a drain region. Charges may flow from the first active region 760 to the second active region 770 in the direction of the arrow 790 through a channel disposed below the gate structure 750. For example, the transistor 701 may be a selection transistor or a reset transistor.

Figure 9B:
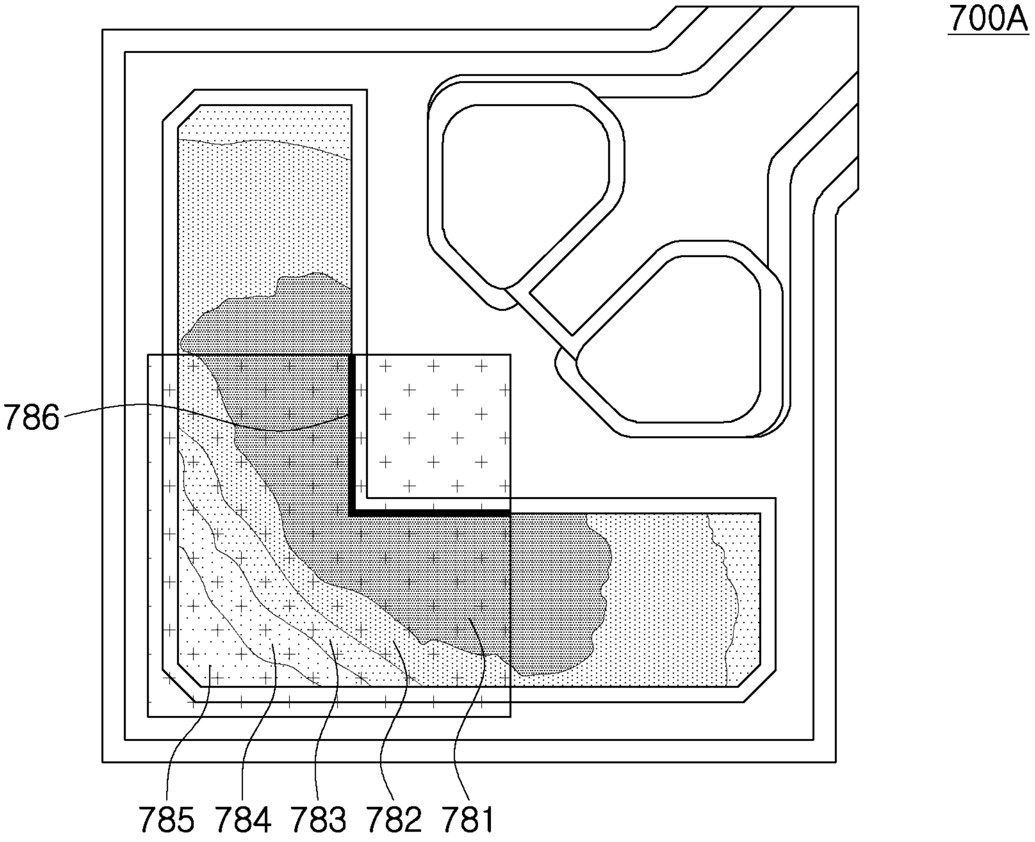

FIG. 9B illustrates a current density according to charges flowing in the transistor 701 according to the example embodiment illustrated in FIG. 9A.

Referring to FIG. 9B, a channel region of the driving transistor 701 may be divided into a first current region 781, a second current region 782, a third current region 783, and a fourth current region 784, and a fifth current region 785 according to current densities. A current density corresponding to the amount of flowing charge may decrease from the first channel region 781 to the fifth channel region 785. In other words, the largest amount of charges may flow in the first current region 781.

However, as illustrated in FIG. 9B, as charges flow in the first current region 781, charges may be trapped at the interface 786 of the separation region. Charges trapped at the interface 786 of the separation region may cause flicker noise.

Flicker noise may be particularly problematic in the driving transistor generating a reset voltage and a pixel voltage by amplifying a voltage of the floating diffusion region 730. Accordingly, in an example embodiment of the present inventive concept, the driving transistor may be formed to have a structure different from that of the transistor 701 according to the example embodiment illustrated in FIGS. 9A and 9B, so that flicker noise may be suppressed. This will be described with reference to FIGS. 10A and 10B hereinafter.

Figure 10A:
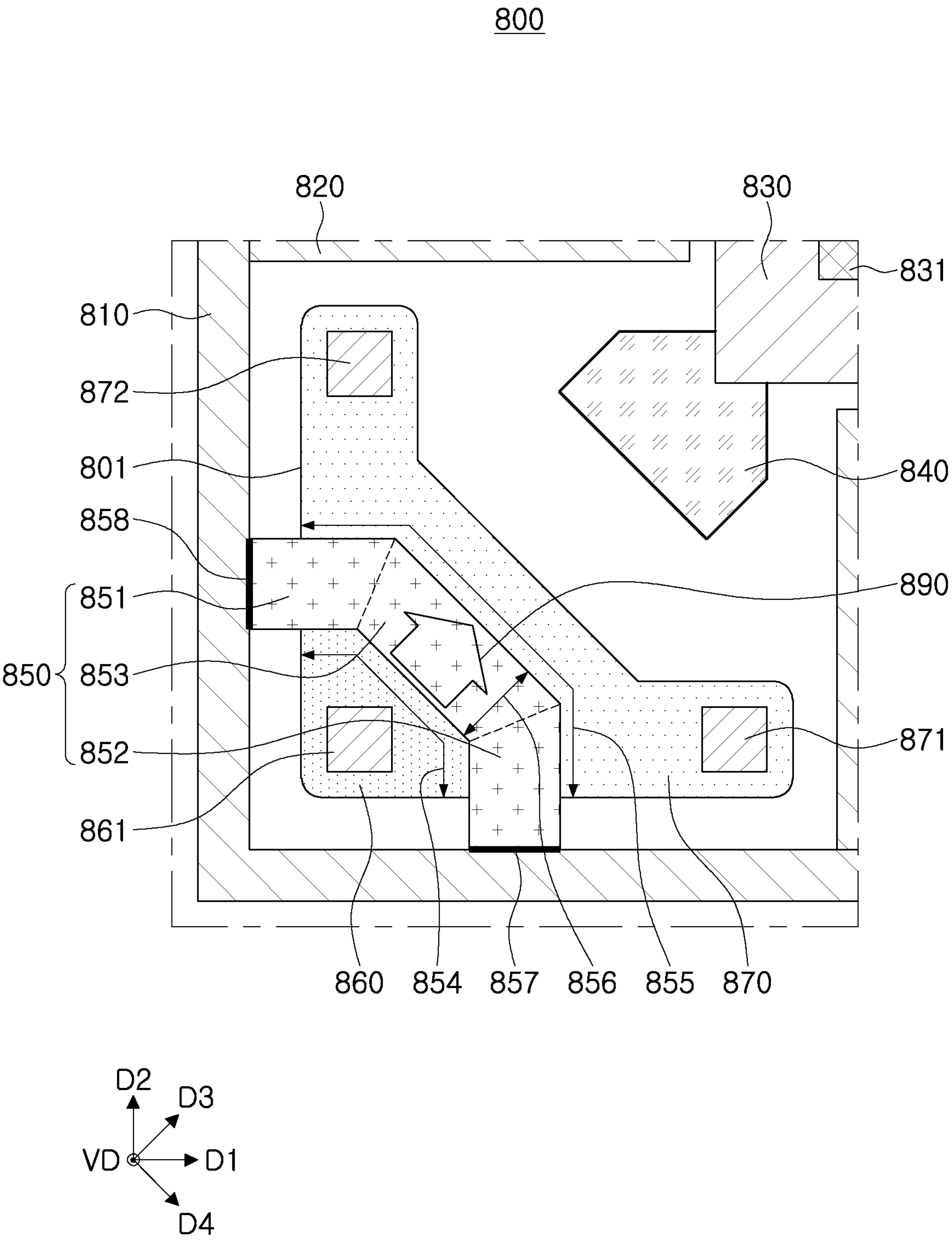

Referring to FIG. 10A, a pixel 800 of an image sensor according to an example embodiment of the present inventive concept may include a transistor 801, a transfer gate structure 840, and a floating diffusion region 830. The transistor 801 may include a first active region 860, a second active region 870, and a gate structure 850. For example, the transistor 801 may be a driving transistor. Structures of the transistor 801 and the gate structure 805 may be understood with reference to the example embodiment described above with reference to FIG. 5. The first active region 860 may be a source region, and the second active region 870 may be a drain region.

As illustrated in FIG. 10A, charges may flow from the first active region 860 to the second active region 870 in the direction of the arrow 890 through the channel below the gate structure 850. However, the present inventive concept is not limited thereto, and charges may flow from the second active region 870 to the first active region 860 through the channel disposed below the gate structure 850 in a direction opposite to the direction of the arrow 890. In this case, the first active region 860 may be a drain region, and the second active region 870 may be a source region.

Figure 10B:
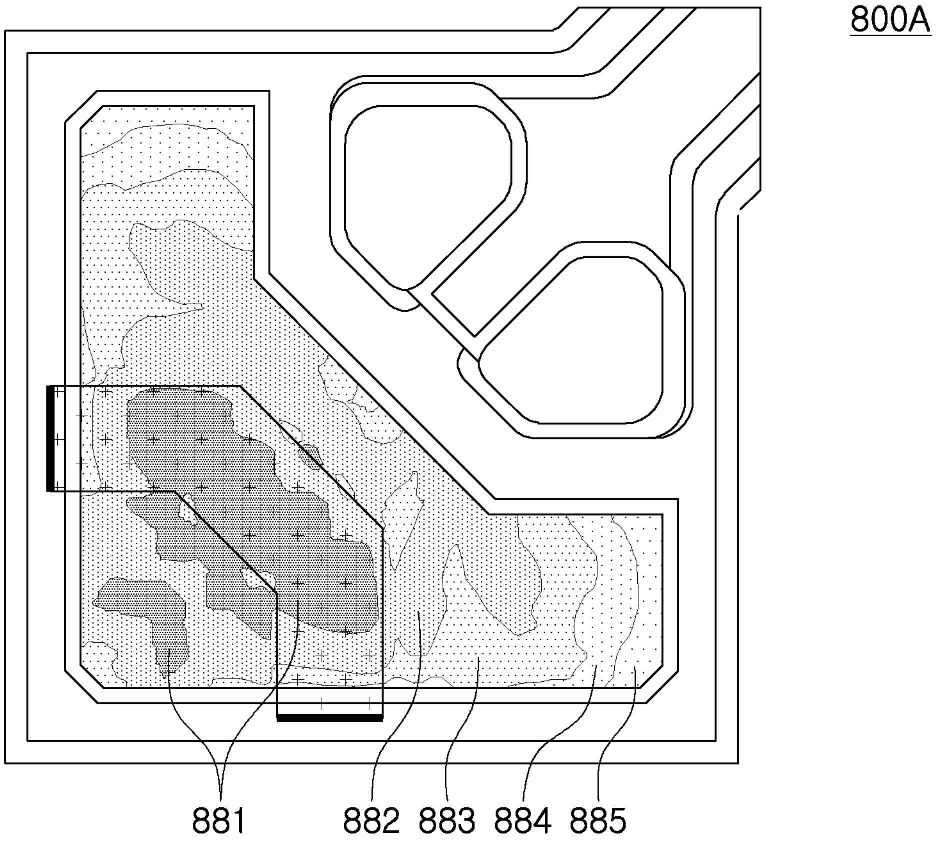

Referring to FIG. 10B, the channel region of the driving transistor may be divided into a first current region 881, a second current region 882, a third current region 883, a fourth current region 884, and a fifth current region 885, according to current densities. A current density corresponding to the amount of flowing charge may decrease from the first channel region 881 to the fifth channel region 885. In other words, the largest amount of charges may flow in the first current region 881.

As illustrated in FIG. 10B, as charges flow into the first current region 881, charge might not be adjacent to the interface of the separation region. Charges trapped at the interface of the separation region may be reduced, and flicker noise may be reduced. Accordingly, dark current, thermal noise, and flicker noise may be suppressed by forming the shape of the transistor 801 differently from that of the transistor 701 according to the example embodiment illustrated in FIG. 9A.

Figure 11:
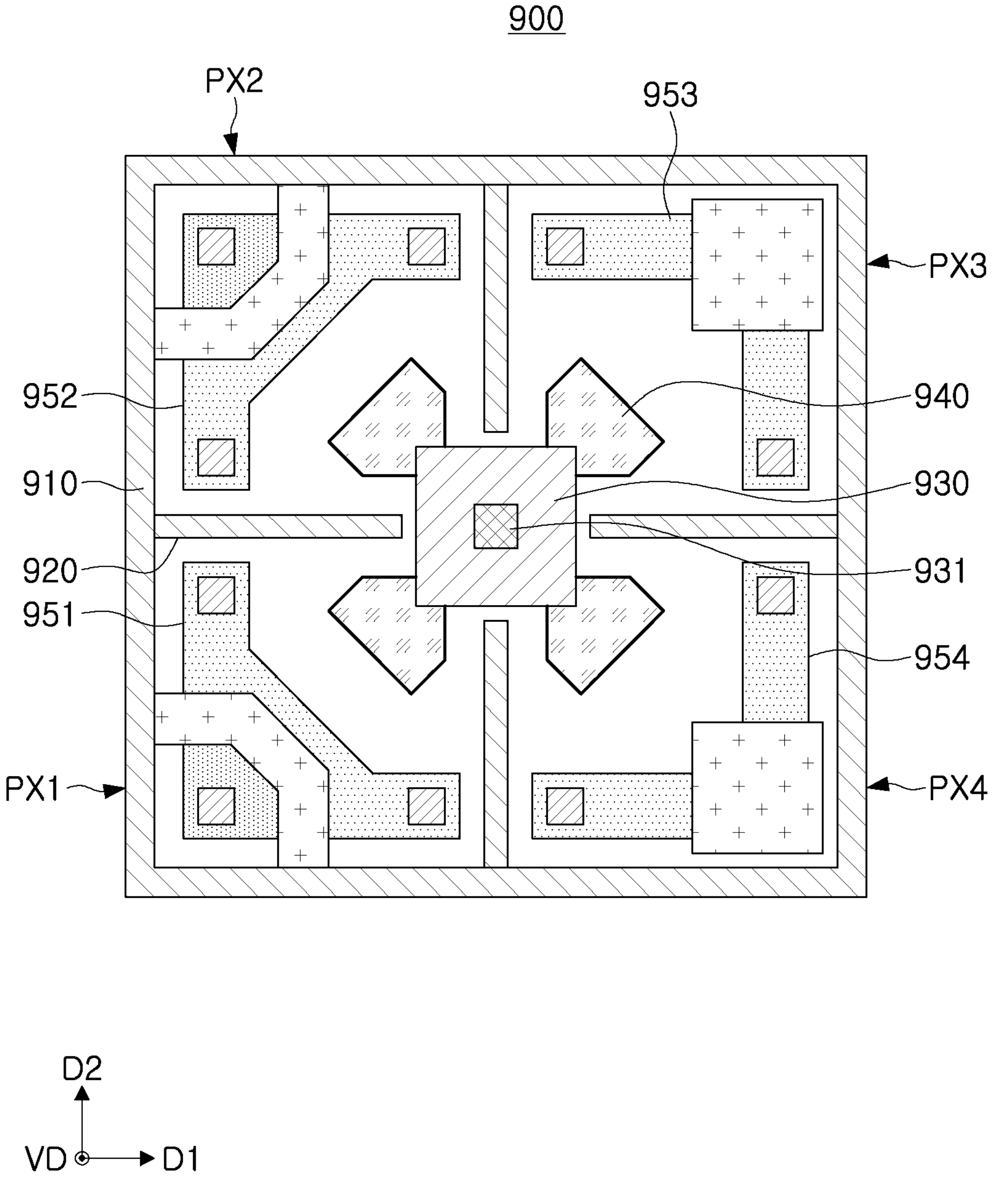
FIG. 11 is a diagram schematically illustrating pixels of an image sensor according to an example embodiment of the present inventive concept.

FIG. 11 is a diagram schematically illustrating pixels of an image sensor according to an example embodiment of the present inventive concept.

For example, FIG. 11 may be a diagram schematically illustrating one of pixel groups included in a pixel array in an image sensor according to an example embodiment of the present inventive concept. Referring to FIG. 11, first to fourth pixels PX1 to PX4 arranged in a 2×2 form in the first direction D1 and the second direction D2 may provide one pixel group 900. The first to fourth pixels PX1 to PX4 included in one pixel group 900 may include a color filter of the same color, and may each separately include a microlens. However, according to an example embodiment, at least some of the first to fourth pixels PX1 to PX4 may include color filters of different colors, or the pixel group 900 may include one microlens. The structure of the pixel group 900 may be understood with reference to the example embodiment described above with reference to FIG. 3.

The pixel group 900 according to the example embodiment illustrated in FIG. 11 may include first to fourth transistors 951 to 954, and the first and second transistors 951 and 952 may have a structure different from that of the third and fourth transistors 953 and 954. As an example, each of the first and second transistors 951 and 952 may be a driving transistor, and one of the third and fourth transistors 953 and 954 may be a reset transistor and the other may be a selection transistor.

For example, each of the first and second transistors 951 and 952 providing the driving transistor may have a structure similar to that described above with reference to FIG. 5. The first and second pixels PX1 and PX2 including the first and second transistors 951 and 952 may be adjacent to each other in at least one of the first and second directions D1 and D2. For example, each of the third and fourth transistors 953 and 954 providing the reset and the selection transistor may have a structure similar to that described above with reference to FIG. 9A. However, the pixel array described with reference to FIG. 11 is only an example embodiment, and the present inventive concept is not necessarily limited thereto. For example, at least one of the third and fourth transistors 953 and 954 may have the same structure as that of the first and second transistors 951 and 952.

Figure 12:
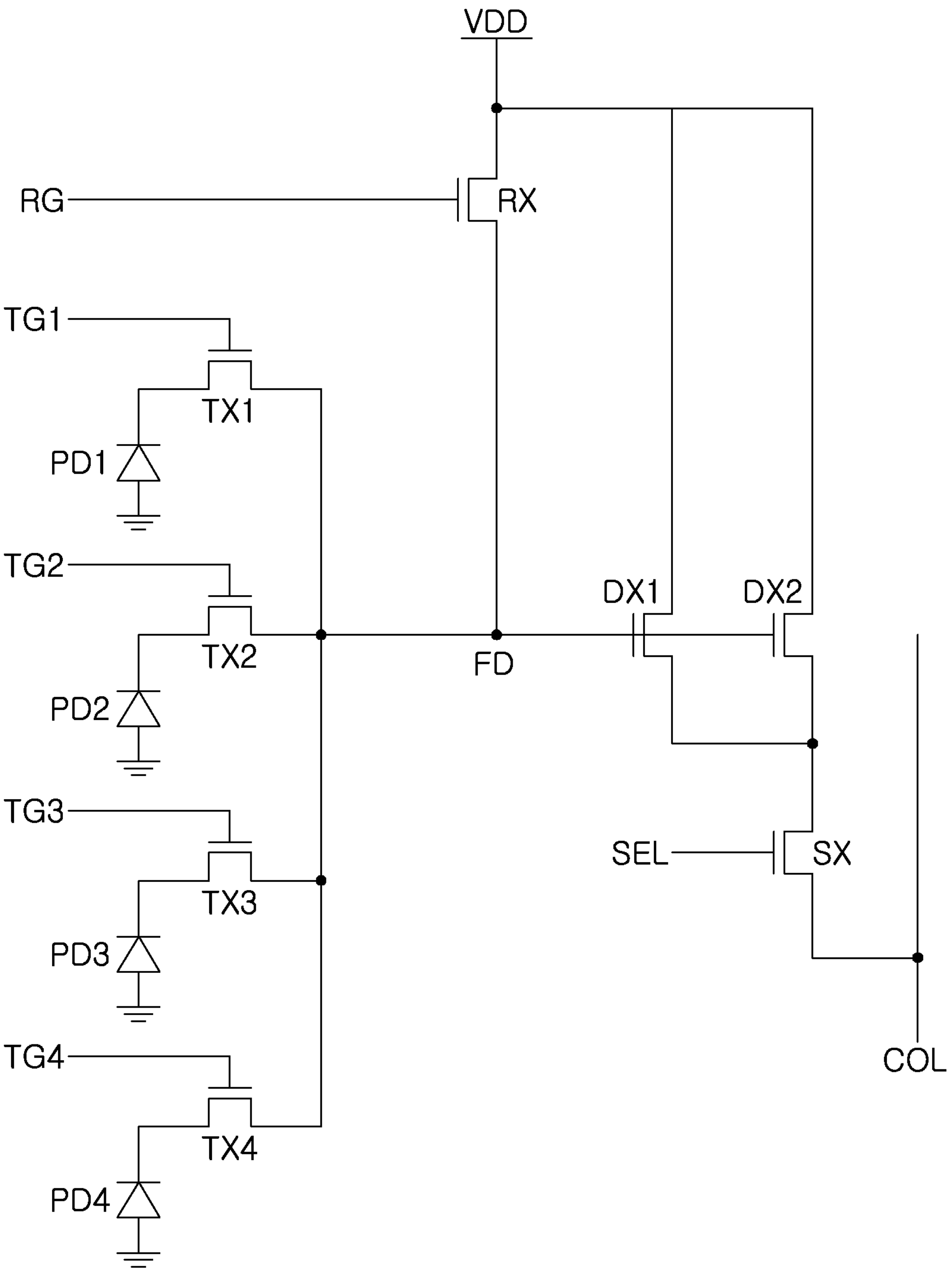
FIG. 12 is a circuit diagram schematically illustrating a pixel circuit according to the example embodiment illustrated in FIG. 11.

FIG. 12 is a circuit diagram schematically illustrating a pixel circuit according to the example embodiment illustrated in FIG. 11.

FIG. 12 may be a circuit diagram schematically illustrating a pixel circuit, of the pixel group 900 illustrated in FIG. 11, including four photodiodes, four transfer gate structures 940, a floating diffusion region 930 shared by four photodiodes, and four transistors 951, 952, 953, and 954. Hereinafter, the configuration of the pixel circuit will be described with reference to FIG. 11.

Referring to FIG. 12, the pixel circuit may include transfer transistors TX1 to TX4, a reset transistor RX, a selection transistor SX, and driving transistors DX1 and DX2. In addition, the pixel circuit may include a floating diffusion node FD in which charges generated by the photodiode are accumulated.

In the example embodiment of FIG. 12, a first photodiode PD1 and a first transfer transistor TX1 of the first pixel PX1 may be connected to the floating diffusion node FD. Similarly, the second to fourth photodiodes PD2 to PD4 of the second to fourth pixels PX2 to PX4 may be connected to the floating diffusion node FD through the second to fourth transfer transistors TX2 to TX4. Each of the first to fourth transfer transistors TX1 to TX4 may be implemented by a transfer gate structure 940 of each of the first to fourth pixels PX1 to PX4 and may be turned on or turned off by each of the first to fourth transmission control signals TG1 to TG4 input to the transfer gate structure 940.

In addition, the pixel circuit may include the first and second driving transistors DX1 and DX2, the reset transistor RX, and the selection transistor SX. For example, among the four transistors 951 to 954 included in the first to fourth pixels PX1 to PX4, first and second transistors 951 and 952 may be connected in parallel to each other to function as first and second driving transistors DX1 and DX2. Further, one of the third and fourth transistors 953 and 954 may provide the selection transistor SX, and the other may provide the reset transistor RX.

However, the pixel circuit described with reference to FIG. 12 is only an example embodiment, and is not necessarily limited thereto. For example, two transistors among the four transistors may be connected in series to be assigned as first and second reset transistors. Further, one transistor may be assigned as a selection transistor, and the other transistor may be assigned as a driving transistor.

Figure 13:
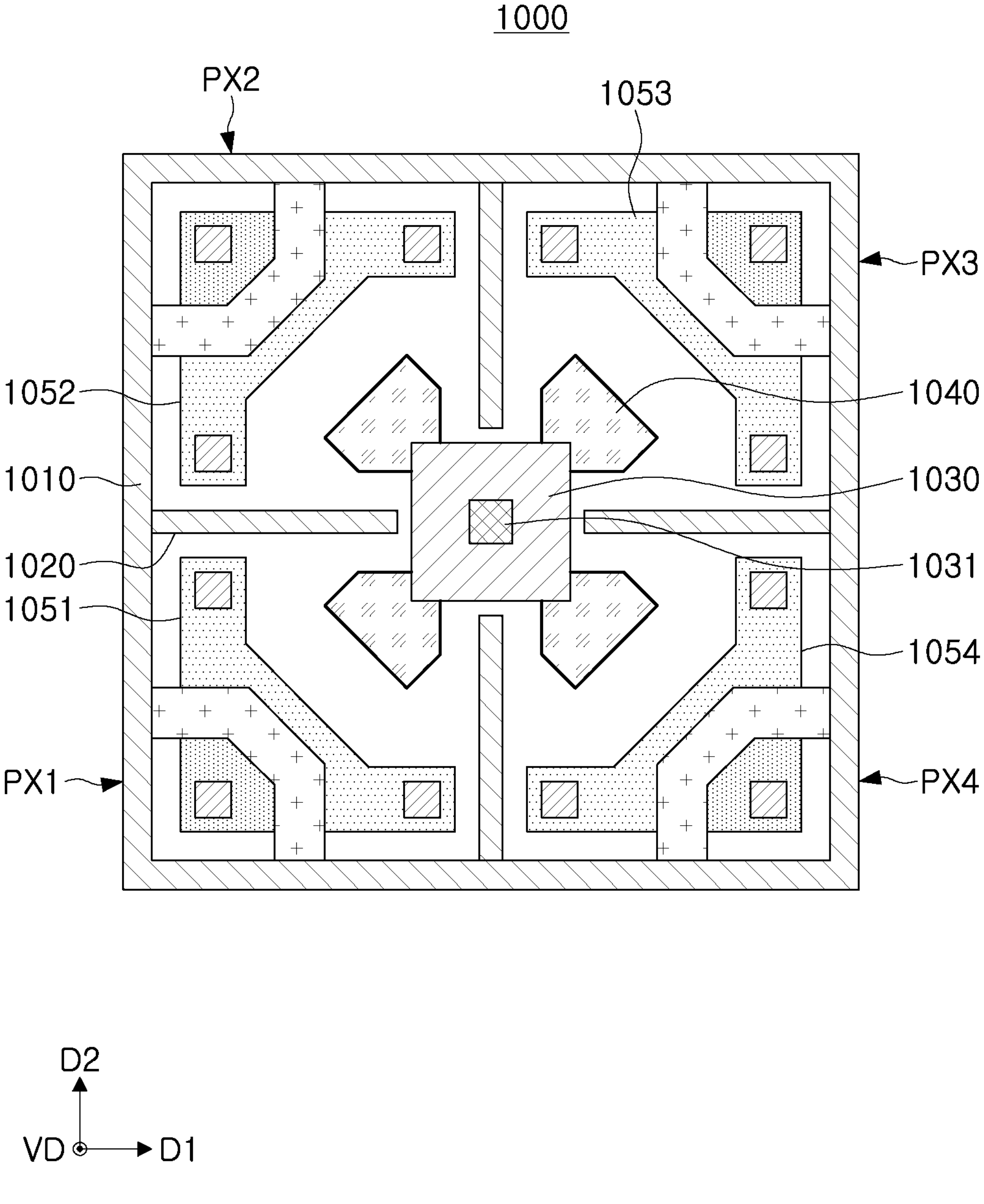
FIG. 13 is a diagram schematically illustrating pixels of an image sensor according to an example embodiment of the present inventive concept.

FIG. 13 is a diagram schematically illustrating pixels of an image sensor according to an example embodiment of the present inventive concept.

For example, FIG. 13 may be a diagram schematically illustrating one of pixel groups included in a pixel array in an image sensor according to an example embodiment of the present inventive concept. Referring to FIG. 13, in the pixel array of the image sensor, first to fourth pixels PX1 to PX4 arranged in a 2×2 form in the first direction D1 and the second direction D2 may provide one pixel group 1000. The first to fourth pixels PX1 to PX4 included in one pixel group 1000 may include a color filter of the same color, and may each separately include a microlens. The structure of the pixel group 1000 may be understood with reference to the example embodiment described above with reference to FIG. 3.

The pixel group 1000 of the image sensor according to the example embodiment illustrated in FIG. 13 may include first to fourth transistors 1051 to 1054, and the first to fourth transistors 1051 to 1054 may all have the same structure. For example, the first to fourth transistors 1051 to 1054 may have the same structure as that of the transistor 401 of the example embodiment illustrated in FIG. 5. The first to fourth transistors 1051 to 1054 may include a driving transistor, a reset transistor, and a selection transistor.

A gate structure of each of the transistors 1051 to 1054 may be separated from a corner of each of the pixels PX1 to PX4, and an active region of each of the transistors 1051 to 1054 may be disposed at their respective corner of each of the first to fourth pixels PX1 to PX4. The first pixel PX1 and the second pixel PX2 may be disposed to be symmetrical with each other with respect to a line therebetween in the first direction D1, and the first pixel PX1 and the fourth pixel PX4 may be disposed to be symmetrical with each other with respect to a line therebetween in the second direction D2. In addition, the third pixel PX3 may be disposed to be symmetrical with the fourth pixel PX4 with respect to a line therebetween in the first direction D1 and may be disposed to be symmetrical with the second pixel PX2 with respect to a line therebetween in the second direction D2.

The transistors 1051 to 1054 may include one of a reset transistor, a selection transistor, and a drive transistor. For example, as illustrated in the circuit diagram illustrated in FIG. 4, two of the four transistors 1051 to 1054 may be connected in series to be assigned to the first and second reset transistors. Further, one transistor may be assigned to the selection transistor, and the other transistor may be assigned to the driving transistor. Alternatively, as described above with reference to FIG. 12, two of the four transistors 1051 to 1054 may be connected in parallel to be assigned to the first and second driving transistors. Further, one transistor may be assigned to the selection transistor, and the other transistor may be assigned to the reset transistor. However, the types of transistors provided by each of the transistors 1051 to 1054 are not limited thereto and may vary according to example embodiments.

Figure 14:
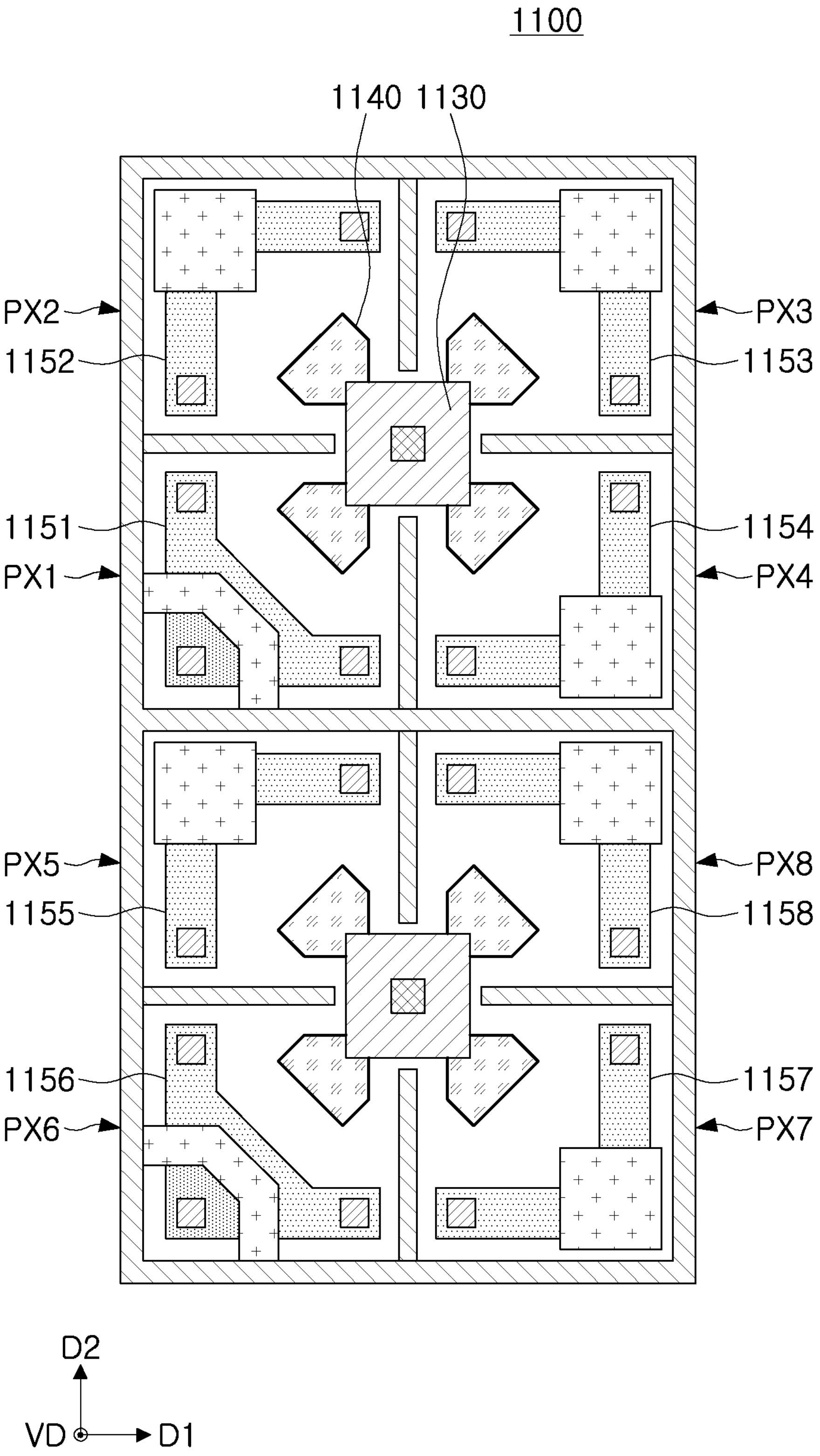
FIGS. 14, 15 and 16 are diagrams schematically illustrating pixels of an image sensor according to an example embodiment of the present inventive concept.
Figure 15:
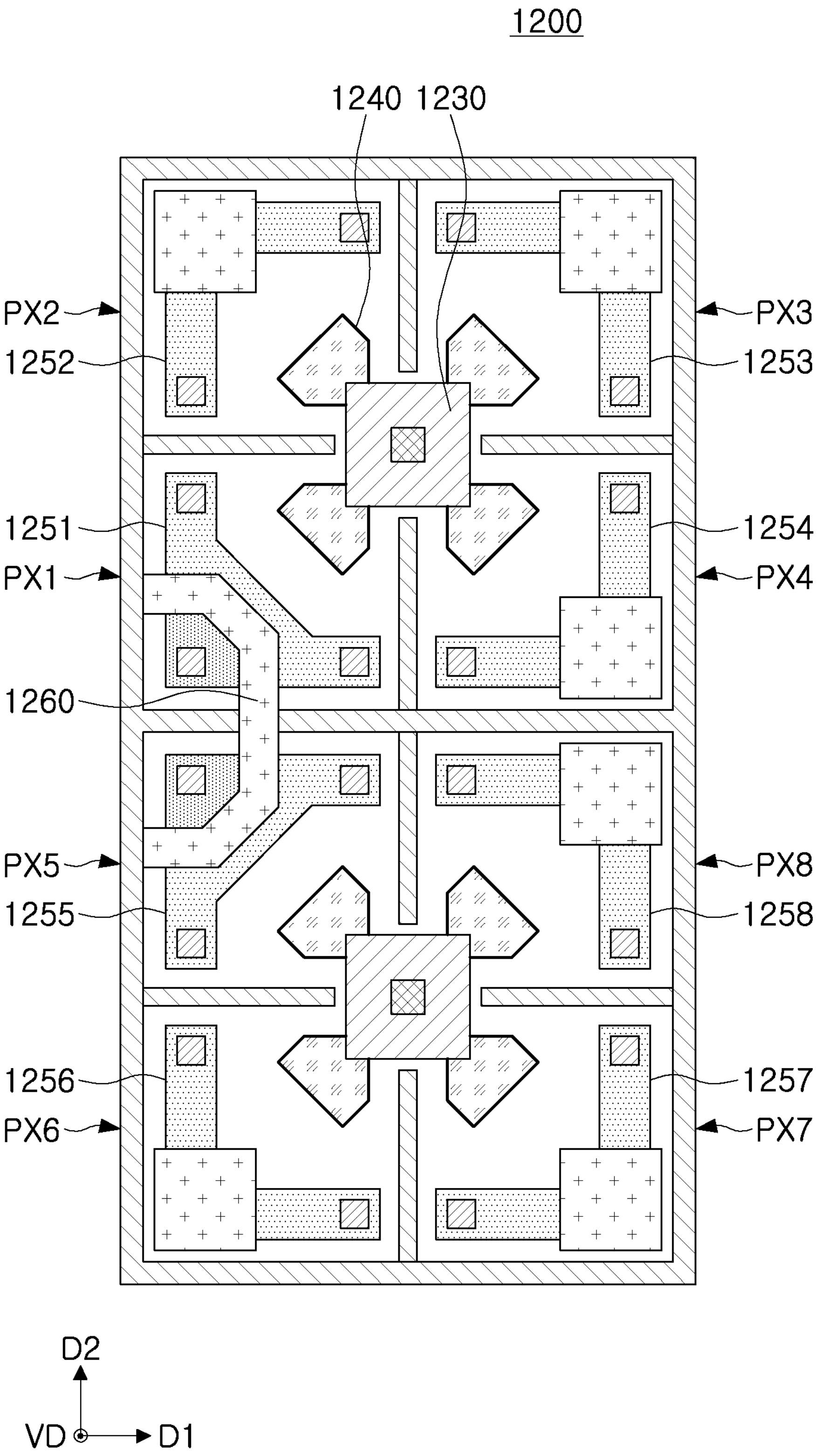
Figure 16:
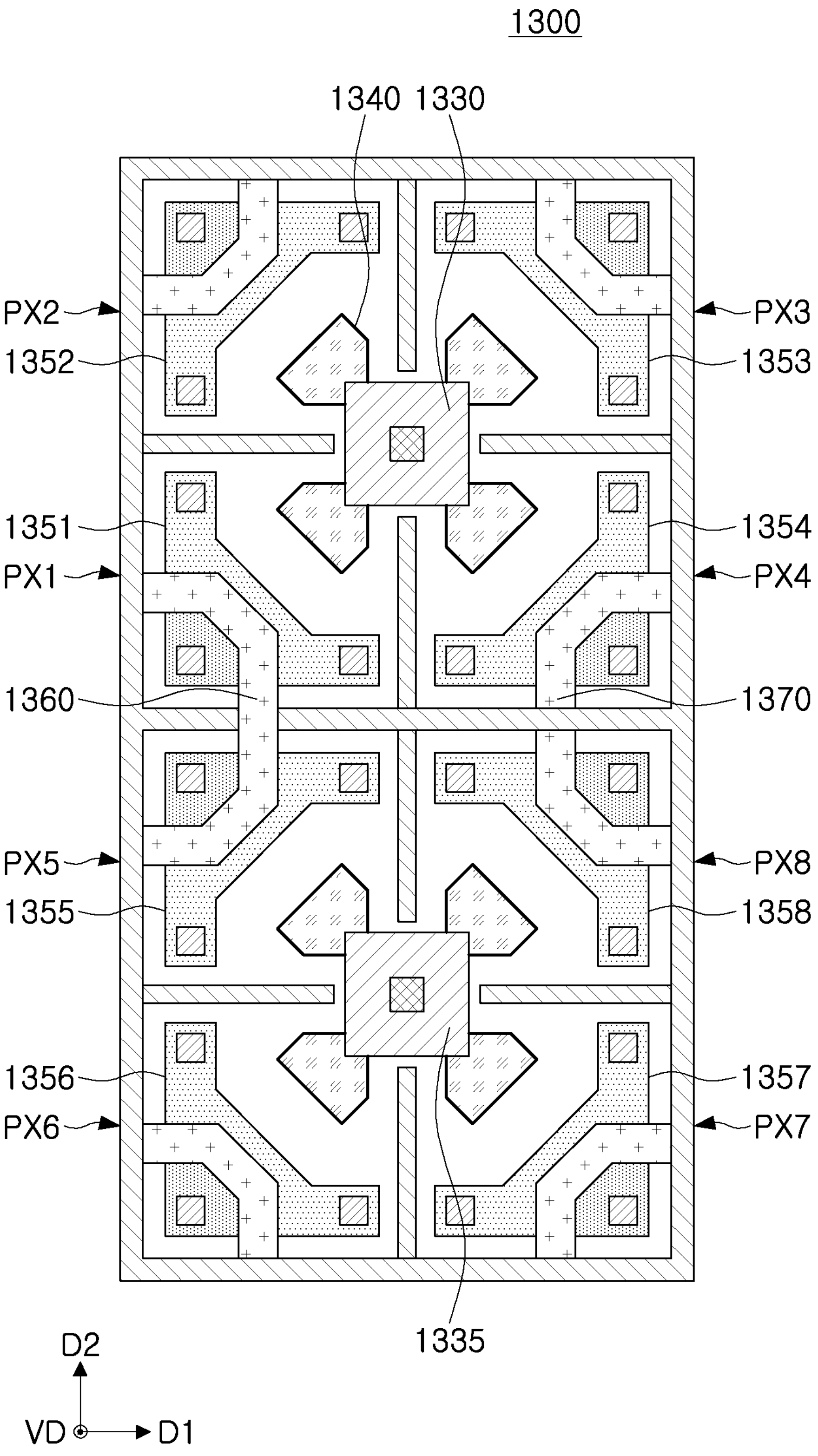

FIGS. 14 to 16 are diagrams schematically illustrating pixels of an image sensor according to an example embodiment of the present inventive concept.

For example, FIGS. 14 to 16 may be diagrams schematically illustrating one of pixel groups included in a pixel array of an image sensor according to an example embodiment of the present inventive concept. Referring to FIGS. 14 to 16, in the pixel array of the image sensor, first to eighth pixels PX1 to PX8 arranged in a 4×2 form in the first direction D1 and the second direction D2 may provide one of pixel groups 1100, 1200, and 1300.

In the example embodiment illustrated in FIG. 14, the first to fourth pixels PX1 to PX4 and the fifth to eighth pixels PX5 to PX8 may be disposed to have the same form as each other. The first to fourth pixels PX1 to PX4 and the fifth to eighth pixels PX5 to PX8 may have a structure similar to that of the example embodiment illustrated in FIG. 3. The first pixel PX1 may have the same structure as that of the sixth pixel PX6, and the second to fourth pixels PX2 to PX4 may have the same structure as that of the fifth pixel PX5, the seventh pixel PX7, and the eighth pixel PX8. As an example, the first transistor 1151 and the sixth transistor 1156 may be driving transistors, and the other transistors 1152, 1153, 1154, 1155, 1157, and 1158 may each provide one of a selection transistor or a reset transistor.

Referring to FIG. 15, in the example embodiment illustrated in FIG. 15, the first pixel PX1 and the fifth pixel PX5 may have the same structure as each other, and the second to fourth pixels PX2 to PX4 and the sixth to eighth pixels PX6 to PX8 may have the same structure as each other. For example, the first pixel PX1 and the fifth pixel PX5 may have a structure similar to that of the example embodiment illustrated in FIG. 5, and the second to fourth pixels PX2 to PX4 and sixth to eighth pixels PX6 to PX8 may have a structure similar to that of the example embodiment illustrated in FIG. 9A. A first transistor 1251 of the first pixel PX1 may share a gate structure 1260 with a fifth transistor 1255 of the fifth pixel PX5.

The pixel group 1200 may be disposed to be symmetrical with respect to a line extending through the center of the pixel group 1200 in the first direction D1. Referring to FIG. 15, the first to fourth pixels PX1 to PX4 and the fifth to eighth pixels PX5 to PX8 may be disposed to be symmetrical with each other with respect to a line extending in the first direction D1 therebetween. As an example, the first transistor 1251 and the fifth transistor 1255 may be driving transistors, and at least some of the other transistors 1252, 1253, 1254, 1256, 1257, and 1258 be a selection transistor and a reset transistor.

In the example embodiment illustrated in FIG. 16, the first to fourth pixels PX1 to PX4 and the fifth to eighth pixels PX5 to PX8 may be disposed in the same form as each other, and transistors 1351 to 1358 of each of the pixels PX1 to PX8 may have the same structure. For example, the first to fourth pixels PX1 to PX4 and the fifth to eighth pixels PX5 to PX8 may have a structure similar to that of the pixel group according to the example embodiment illustrated in FIG. 13. The transistor 1351 of the first pixel PX1 and the transistor 1355 of the fifth pixel PX5 may share a gate structure 1360. In the pixel group 1300, the first to fourth pixels PX1 to PX4 and the fifth to eighth pixels PX5 to PX8 may be disposed to be symmetrical to each other with respect to a line extending in the first direction D1 therebetween.

Each of the transistors 1351 to 1358 may include one of a driving transistor, a reset transistor, a selection transistor, and a dummy transistor. For example, the first transistor 1351, the second transistor 1352, and the fifth transistor 1355 may be connected in parallel to function as first to third driving transistors, and the other transistors 1353, 1354, and 1356 to 1358 may function as reset transistors, selection transistors, and the like.

For example, two of the other transistors 1353, 1354, and 1356 to 1358 may be assigned to a first reset transistor and a second reset transistor connected in series with each other. One of the other transistors 1353, 1354, and 1356 to 1358 may be assigned to a selection transistor, and each of the transistors not assigned to the first reset transistor, the second reset transistor, and the selection transistor may be assigned as a dummy transistor. However, a method of implementing the pixel circuit is not necessarily limited thereto, and the types of transistors provided by the respective transistors 1351 to 1358 may vary according to example embodiments.

Figure 17:
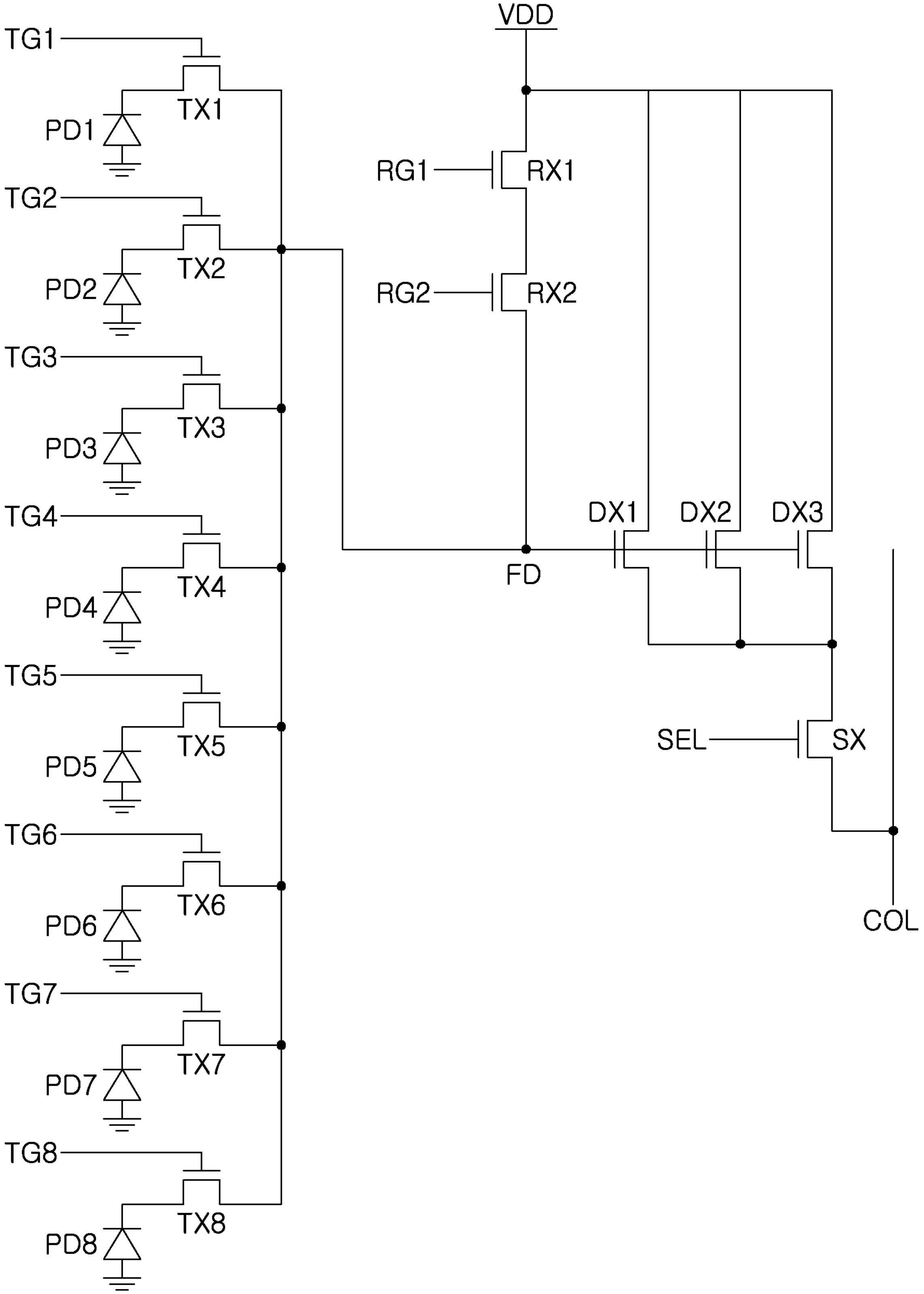
FIGS. 17 and 18 are circuit diagrams schematically illustrating a pixel circuit according to an example embodiment of the present inventive concept.
Figure 18:
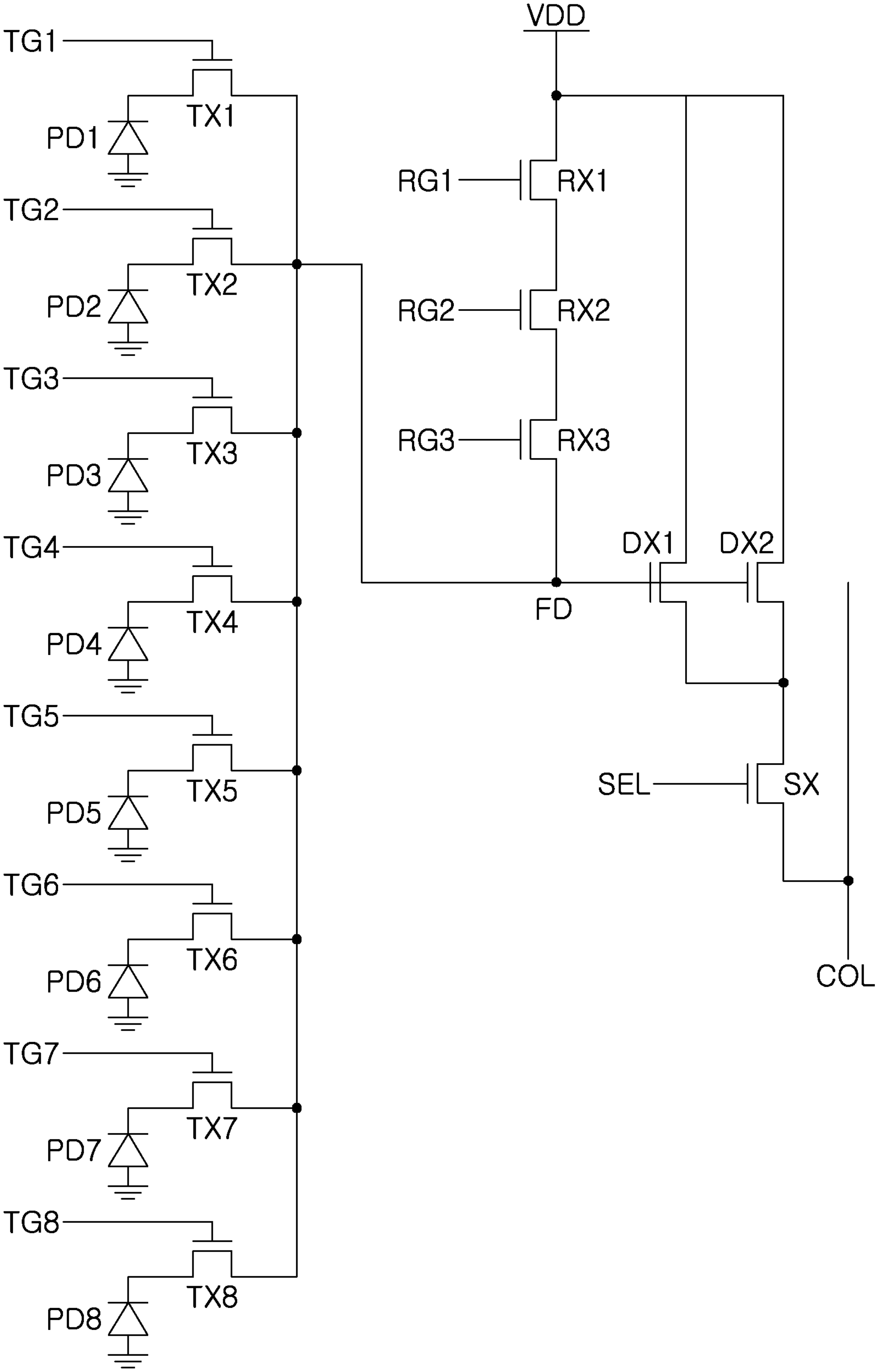

FIGS. 17 and 18 are circuit diagrams schematically illustrating a pixel circuit according to an example embodiment of the present inventive concept.

FIG. 17 may be a circuit diagram schematically illustrating a pixel circuit of the pixel group 1300 illustrated in FIG. 16. Hereinafter, the configuration of the pixel circuit illustrated in FIG. 17 will be described with reference to FIG. 16.

Referring to FIG. 17, the pixel circuit may include transfer transistors TX1 to TX8, reset transistors RX1 and RX2, a selection transistor SX, and driving transistors DX1 to DX3, and the like. In addition, the pixel circuit may include a floating diffusion node FD in which charges generated by the photodiodes PD1 to PD8 are accumulated.

In the example embodiment illustrated in FIG. 16, the first photodiode PD1 of the first pixel PX1 may be connected to the floating diffusion node FD through the first transfer transistor TX1. Similarly, the second to eighth photodiodes PD2 to PD8 of the second to eighth pixels PX2 to PX8 may be connected to the floating diffusion node FD through the second to fourth transfer transistors TX2-TX8, respectively. Each of the first to eighth transfer transistors TX1 to TX8 may be implemented by a transfer gate structure 1340 of each of the first to eighth pixels PX1 to PX8 and may be turned on or turned off by each of the first to eighth transmission control signals TG1 to TG8, respectively, input to the transfer gate structure 1340.

In addition, the pixel circuit may include first to third driving transistors DX1 to DX3, first and second reset transistors RX1 and RX2, a selection transistor SX, and two dummy transistors. For example, three of the eight transistors 1351 to 1358 included in the first to eighth pixels PX1 to PX8 may be connected in parallel to each other to function as first to third driving transistors DX1 to DX3. Further, of the remaining transistors 1351 to 1358, one transistor may be a selection transistor SX, two transistors may be first and second reset transistors RX1 and RX2, and the other two transistors may be dummy transistors.

FIG. 18 may be a circuit diagram schematically illustrating a pixel circuit of one of the pixel groups 1100, 1200, and 1300 illustrated in FIGS. 14 to 16. Hereinafter, the configuration of the pixel circuit illustrated in FIG. 18 will be described with reference to FIGS. 14 to 16 together.

The pixel circuit illustrated in FIG. 18 may include transfer transistors TX1 to TX8, reset transistors RX1 to RX3, a selection transistor SX, driving transistors DX1 and DX2, and the like. In addition, the pixel circuit may include a floating diffusion node FD in which charges generated by the photodiode are accumulated.

In the example embodiment illustrated in FIGS. 14 to 16, the first photodiode PD1 of the first pixel PX1 may be connected to the floating diffusion node FD through the first transfer transistor TX1. Similarly, the second to eighth photodiodes PD2 to PD8 of the second to eighth pixels PX2 to PX8 may be connected to the floating diffusion node FD through the second to fourth transfer transistors TX2 to TX8, respectively. Each of the first to eighth transfer transistors TX1 to TX8 may be implemented by the transfer gate structures 1140, 1240, and 1340 of each of the first to eighth pixels PX1 to PX8 and may be respectively turned on or turned off by each of the first to eighth transmission control signals TG1 to TG8 input to the transfer gate structures 1140, 1240, and 1340.

In addition, the pixel circuit may include first and second driving transistors DX1 and DX2, first to third reset transistors RX1 to RX3, a selection transistor SX, and two dummy transistors. For example, two of the eight transistors 1351 to 1358 included in the first to eighth pixels PX1 to PX8 of each of the pixel groups 1100, 1200, and 1300 may be connected in parallel to each other to function as the first and second driving transistors DX1 and DX2. Further, of the remaining transistors 1351 to 1358, one transistor may be a selection transistor SX, three transistors may be the first to third reset transistors RX1 to RX3, and the other two transistors may be dummy transistors.

However, the pixel circuit described above with reference to FIGS. 17 and 18 is only an example embodiment, and the present inventive concept is not necessarily limited thereto. If necessary, the pixel circuit corresponding to the pixel group 1300 according to the example embodiment illustrated in FIG. 16 may be implemented in a structure different from that described above with reference to FIGS. 17 and 18.

According to an example embodiment of the present inventive concept, a driving transistor of a pixel circuit may be formed so that noise occurring due to a manufacturing process of an image sensor and/or an operation of the image sensor may be minimized. For example, by suppressing the influence generated at the interface between the gate structure of the driving transistor and the separation region and optimizing the ratio of the channel width to the channel length of the driving transistor, random noise may be suppressed to increase the performance of the image sensor.

While the present inventive concept has been described with reference to embodiments thereof, it will be understood by those of ordinary skill in the art that various changes in form and details may be made thereto without departing from the spirit and scope of the present inventive concept.

What is claimed is:

1. An image sensor comprising:

a pixel array including a plurality of pixels arranged in first and second directions that are parallel to an upper surface of a substrate and substantially perpendicular to each other; and a logic circuit acquiring a pixel signal from the plurality of pixels, wherein each of the plurality of pixels includes at least one photodiode and a pixel circuit region disposed on the at least one photodiode, wherein the pixel array includes a plurality of pixel groups each having four or more pixels, among the plurality of pixels, adjacent to each other in the first direction and the second direction, wherein the pixel circuit region in each of the plurality of pixel groups includes a plurality of transistors, wherein at least one of the plurality of transistors is a driving transistor including a first active region, a second active region, and a gate structure disposed between the first active region and the second active region in a third direction parallel to the upper surface of the substrate and intersecting the first direction and the second direction, and wherein the gate structure includes a first gate region, a second gate region, and a third gate region, wherein the first gate region extends in the first direction, wherein the second gate region extends in the second direction, and the third gate region extends in a fourth direction that is different from the first, second and third directions.

2. The image sensor of claim 1, wherein the plurality of transistors in each of the plurality of pixel groups further include a reset transistor and a selection transistor, and at least one of the reset transistor or the selection transistor has the same structure as a structure of the driving transistor.

3. The image sensor of claim 1, wherein the gate structure of the driving transistor includes a first edge and a second edge, wherein the first edge is separated from the first active region and the second active region and extends in the first direction, and the second edge is separated from the first active region and the second active region and extends in the second direction, and a length of the first edge is substantially equal to a length of the second edge.

4. The image sensor of claim 1, wherein the gate structure of the driving transistor includes a first edge and a second edge, wherein the first edge is separated from the first active region and the second active region and extends in the first direction, and the second edge is separated from the first active region and the second active region and extends in the second direction, and a length of the first edge is different from a length of the second edge.

5. The image sensor of claim 1, wherein the gate structure of the driving transistor has a symmetrical structure with respect to a line extending through a center of the gate structure in the third direction.

6. The image sensor of claim 1, wherein the driving transistor includes at least one first active contact connected to the first active region and at least one second active contact connected to the second active region, and a number of the at least one first active contact is different from a number of the at least one second active contact.

7. The image sensor of claim 6, wherein the number of the at least one first active contact is less than the number of the least one second active contact, and an area of the first active region is less than an area of the second active region.

8. The image sensor of claim 7, wherein the number of the at least one second active contact is 2.

9. The image sensor of claim 6, wherein the first active region is a source region, and the second active region is a drain region.

10. The image sensor of claim 1, wherein the driving transistor includes a first active contact and a second active contact, wherein the first active contact is connected to the first active region, and the second active contact is connected to the second active region, and the first active region is a source region and the second active region is a drain region.

11. The image sensor of claim 1, wherein the fourth direction is parallel to the upper surface of the substrate and is substantially perpendicular to the third direction.

12. The image sensor of claim 1, wherein each of an area of the first gate region and an area of the second gate region is less than an area of the third gate region.

13. The image sensor of claim 1, wherein a length of a side surface of the gate structure in contact with the first active region is different from a length of a side surface of the gate structure in contact with the second active region.

14. The image sensor of claim 1, wherein a length of a channel of the driving transistor is less than about ½ of a width of the channel of the driving transistor.

15. The image sensor of claim 1, wherein a width of a channel of the driving transistor gradually increases in the third direction.

16. The image sensor of claim 1, wherein each of the plurality of pixel groups includes four pixels.

17. The image sensor of claim 1, wherein each of the plurality of pixel groups includes eight pixels.

18. An image sensor comprising:

a pixel array including a plurality of pixels are arranged in first and second directions parallel to a first surface of a substrate and substantially perpendicular to each other; and a logic circuit acquiring a pixel signal from the plurality of pixels, wherein each of the plurality of pixels includes at least one photodiode and a pixel circuit region disposed on the at least one photodiode, wherein the pixel array includes a plurality of pixel groups each having four or more pixels, among the plurality of pixels, adjacent to each other in the first direction and the second direction, wherein the pixel circuit region in each of the plurality of pixel groups includes a plurality of transistors, wherein at least one of the plurality of transistors is a driving transistor including a first active region, a second active region, and a gate structure, wherein at least one of the first active region or the second active region is adjacent to a corner of a pixel including the driving transistor, wherein the gate structure is separated from the corner, and wherein the first active region, the second active region, and the gate structure are disposed between the first active region and the second active region in a third direction intersecting the first direction and the second direction, and wherein the gate structure includes a first gate region, a second gate region, and a third gate region, wherein the first gate region extends in the first direction, wherein the second gate region extends in the second direction, and the third gate region extends in a fourth direction that is different from the first, second and third directions.

* * * * *